(12) United States Patent
Torii

(10) Patent No.: US 12,165,849 B2
(45) Date of Patent: Dec. 10, 2024

(54) PLASMA PROCESSING APPARATUS AND ETCHING METHOD

(71) Applicant: Tokyo Electron Limited, Tokyo (JP)

(72) Inventor: Natsumi Torii, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 169 days.

(21) Appl. No.: 17/949,380

(22) Filed: Sep. 21, 2022

(65) Prior Publication Data

US 2023/0091584 A1 Mar. 23, 2023

(30) Foreign Application Priority Data

Sep. 21, 2021 (JP) ................................. 2021-153295
Sep. 6, 2022 (JP) ................................. 2022-141352

(51) Int. Cl.
*H01J 37/32* (2006.01)

(52) U.S. Cl.
CPC .. *H01J 37/32532* (2013.01); *H01J 37/32183* (2013.01); *H01J 37/32642* (2013.01)

(58) Field of Classification Search
CPC .......... H01J 37/32532; H01J 37/32183; H01J 37/32642; H01J 37/32715; H01J 37/32935; H01J 37/32091; H01J 37/32146; H01L 21/6833
See application file for complete search history.

(56) References Cited

U.S. PATENT DOCUMENTS

2009/0206058 A1* 8/2009 Iwata ................ H01J 37/32027
156/345.35

FOREIGN PATENT DOCUMENTS

JP 2017-228526 A 12/2017

* cited by examiner

*Primary Examiner* — Wei (Victor) Y Chan
(74) *Attorney, Agent, or Firm* — XSENSUS LLP

(57) ABSTRACT

A plasma processing apparatus comprising: a chamber; a substrate support disposed in the chamber and including a lower electrode, a substrate supporting surface for supporting a substrate, and an edge ring disposed to surround the substrate placed on the substrate supporting surface; an upper electrode disposed above the lower electrode; a power supply portion configured to supply two or more powers having different frequencies, the power supply portion including a source power supply configured to supply a source power for generating plasma from a gas in the chamber to the upper electrode or the lower electrode, and at least one bias power supply configured to supply one bias power or two or more bias powers having different frequencies to the lower electrode; at least one variable passive component electrically connected to the edge ring; and at least one bypass circuit that electrically connects the power supply portion and the edge ring and is configured to supply a part of at least one power selected from the group consisting of the source power and at least one bias power to the edge ring.

17 Claims, 29 Drawing Sheets

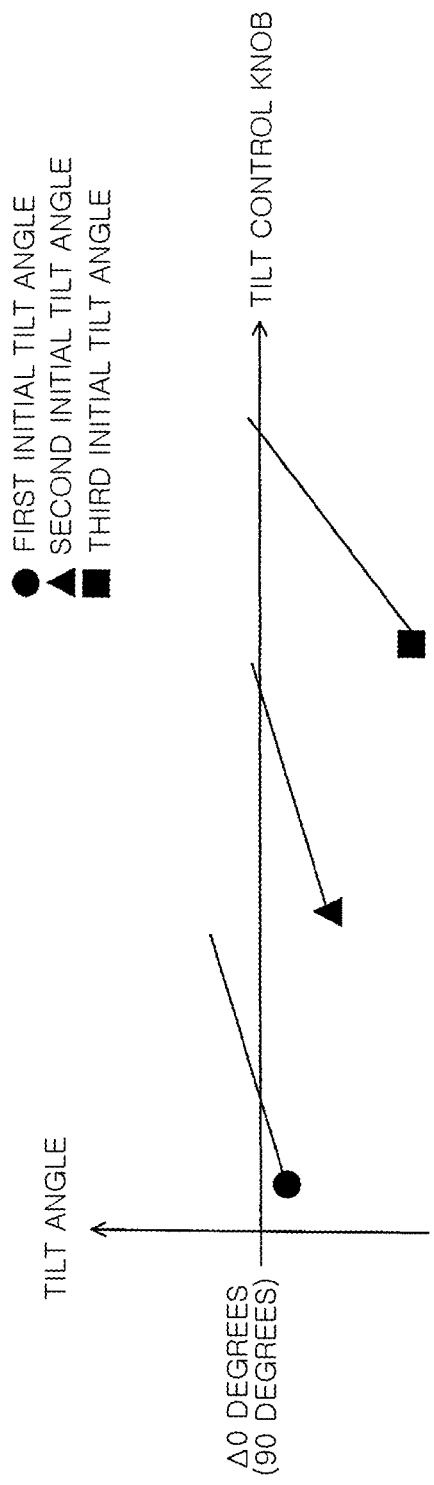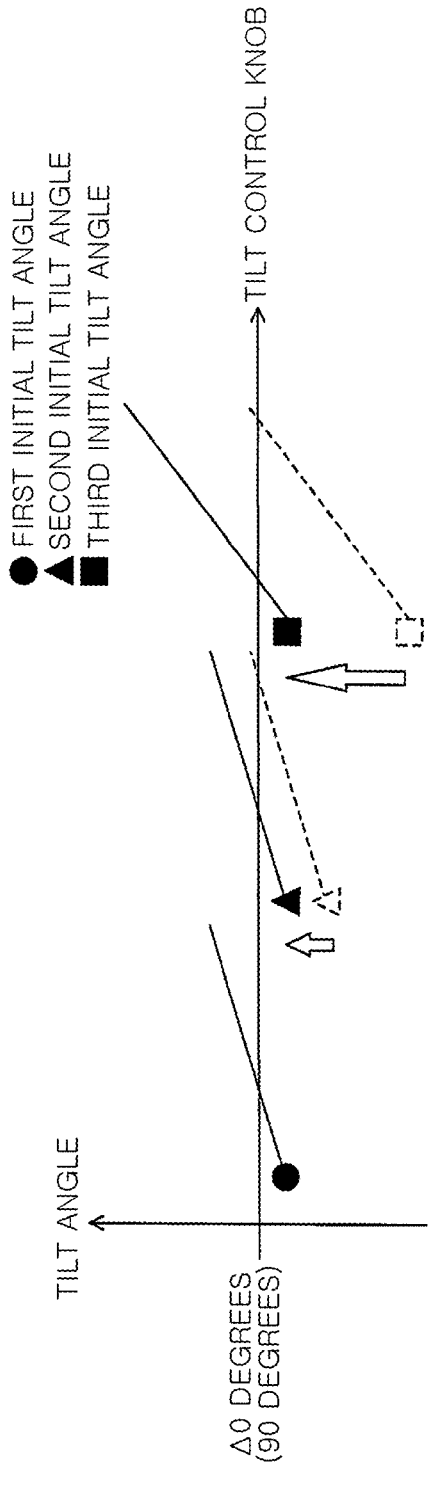

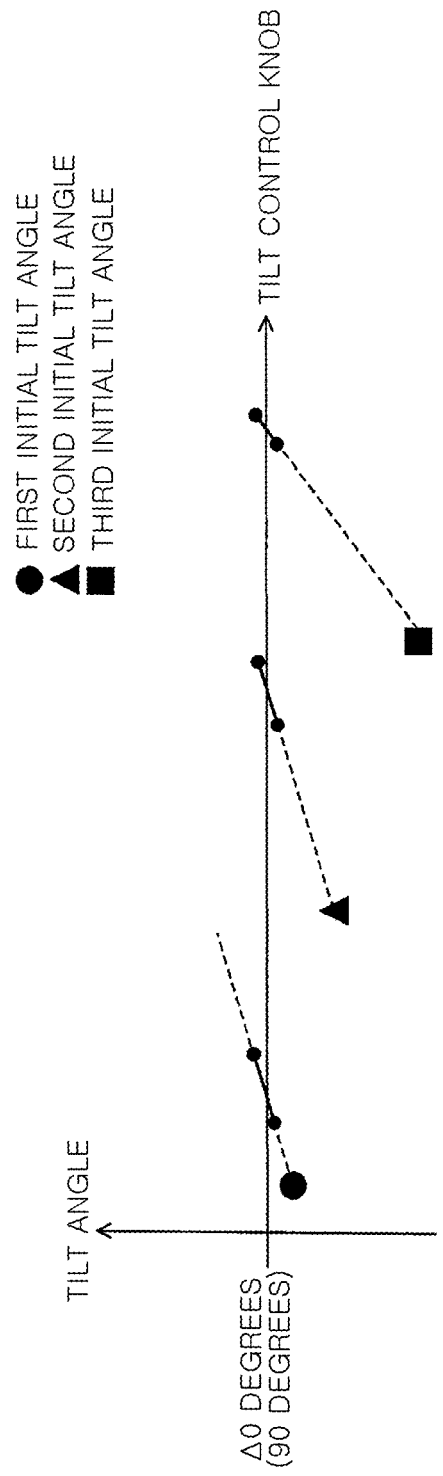
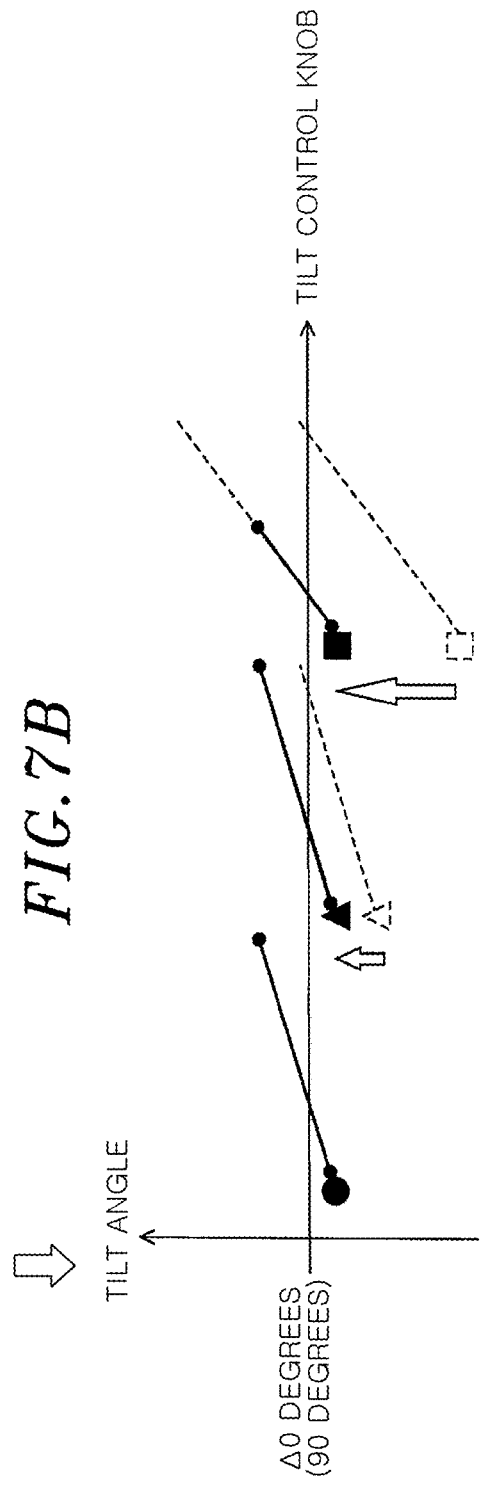

PLASMA PROCESSING APPARATUS AND ETCHING METHOD

CROSS-REFERENCE TO RELATED APPLICATIONS

This application claims priority to Japanese Patent Application Nos. 2021-153295 filed on Sep. 21, 2021 and 2022-141352 filed on Sep. 6, 2022, the entire contents of each are incorporated herein by reference.

TECHNICAL FIELD

The present disclosure relates to a plasma processing apparatus and an etching method.

BACKGROUND

Japanese Laid-open Patent Publication No. 2017-228526 discloses a system for controlling directionality of an ion bundle in an edge region in a plasma chamber. The system includes an RF generator configured to generate an RF signal, an impedance matching circuit receiving the RF signal to generate a corrected RF signal, and a plasma chamber. The plasma chamber includes an edge ring and a coupling ring for receiving a corrected RF signal. The coupling ring includes an electrode receiving the corrected RF signal and an electrode generating capacitance between the coupling ring and the edge ring and controlling the directionality of the ion bundle.

SUMMARY

The technique according to the present disclosure appropriately controls an incident angle of ions in a plasma with respect to an edge region of a substrate in plasma processing.

One aspect of the present disclosure is a plasma processing apparatus comprising, a chamber, a substrate support disposed in the chamber and including a lower electrode, a substrate supporting surface for supporting a substrate, and an edge ring disposed to surround the substrate placed on the substrate supporting surface, an upper electrode disposed above the lower electrode; a power supply configured to supply two or more powers having different frequencies, the power supply including a source power supply configured to supply a source power for generating plasma from a gas in the chamber to the upper electrode or the lower electrode, and at least one bias power supply configured to supply one bias power or two or more bias powers having different frequencies to the lower electrode, at least one variable passive component electrically connected to the edge ring and at least one bypass circuit that electrically connects the power supply and the edge ring and is configured to supply a part of at least one power selected from the group consisting of the source power and at least one bias power to the edge ring.

BRIEF DESCRIPTION OF THE DRAWINGS

FIG. 5 is an explanatory view illustrating a form in which a tilt angle is changed when an initial tilt angle is not adjusted.

FIG. 6 is an explanatory view illustrating a form in which a tilt angle is changed when an initial tilt angle is adjusted.

FIGS. 7A and 7B are explanatory views illustrating a control range of a tilt angle by a tilt control knob.

DETAILED DESCRIPTION

Figure 1:
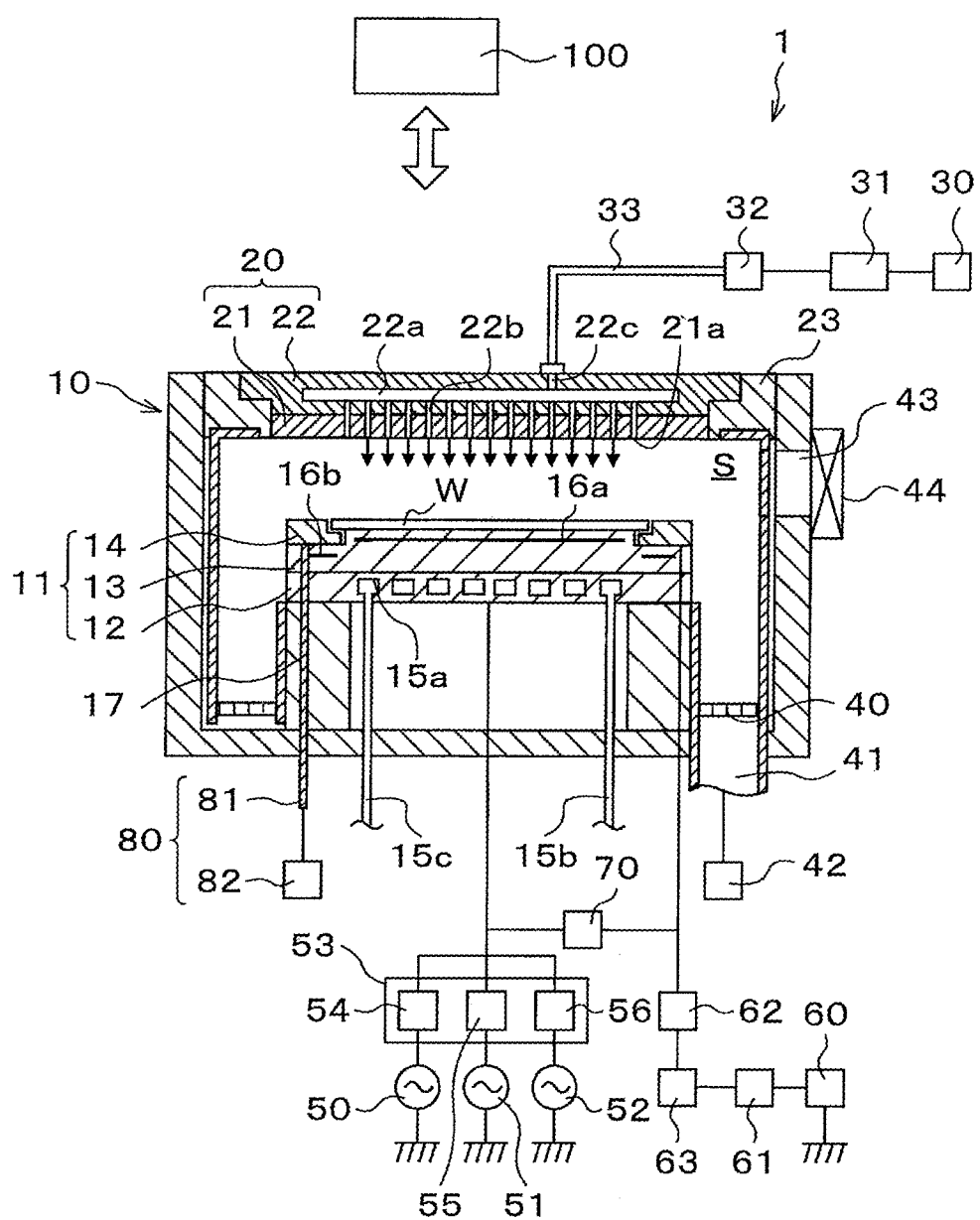
FIG. 1 is a longitudinal sectional view schematically illustrating a configuration of an etching apparatus according to the present embodiment.

In a semiconductor device manufacturing process, a plasma processing, such as etching, is performed on a semiconductor wafer (hereinafter referred to as "wafer"). In the plasma processing, plasma is generated by exciting a processing gas, and the wafer is processed by the plasma.

The plasma processing is performed in a plasma processing apparatus. A plasma processing apparatus generally includes a chamber, a stage, and a radio frequency (RF) power supply. In an example, the high frequency power supply includes a first high frequency power supply and a second high frequency power supply. The first high frequency power supply supplies first high frequency power to generate plasma of a gas in the chamber. The second high frequency power supply supplies second high frequency power for bias to a lower electrode in order to attract ions into the wafer. The stage is provided in the chamber. The stage has a lower electrode and an electrostatic chuck. In an example, an edge ring is disposed on an electrostatic chuck to surround the wafer mounted on the electrostatic chuck. The edge ring is provided to improve the uniformity of the plasma processing to the wafer.

The edge ring is consumed over time during which the plasma processing is performed, so that a thickness of the edge ring decreases. As the thickness of the edge ring decreases, a shape of a sheath changes above the edge region of the wafer and the edge region. When the shape of the sheath is changed in this way, an incident direction of ions in the edge region of the wafer is inclined with respect to a vertical direction. As a result, a concave portion formed in the edge region of the wafer is inclined with respect to a thickness direction of the wafer.

In order to form the concave portion extending in the thickness direction of the wafer in the edge region of the wafer, that is, to control a tilt angle that is an inclination with respect to the thickness direction of the wafer W of the concave portion, an inclination of the incident direction of ions to the edge region of the wafer needs to be adjusted. Therefore, in order to control the incident direction (directionality of the ion bundle) of ions to the edge region, for example, in Japanese Laid-open Patent Publication No. 2017-228526, it is proposed to generate capacitance between the electrode of the coupling ring and the edge ring as described above.

Here, when the tilt angle is controlled for each of high frequency powers of a plurality of frequencies, an initial tilt angle before a plasma processing (hereinafter referred to as "initial tilt angle") may be different for each frequency. The initial tilt angle is, for example, a tilt angle when an etching apparatus 1 is operated or when the etching apparatus 1 is operated after maintenance, and once the initial tilt angle is adjusted, there is no need to adjust the tilt angle again. In this way, when the initial tilt angle is not uniform, for example, it may be sometimes difficult to align and control the tilt angle for each frequency even if the capacitance is generated and an incidence angle is adjusted, as disclosed in Japanese Laid-open Patent Publication No. 2017-228526.

The technique according to the present disclosure appropriately control a tilt angle in an edge region by adjusting an initial tilt angle in an edge region of a substrate in etching.

Hereinafter, an etching apparatus as a plasma processing apparatus and etching method according to the present embodiment are described with reference to the drawings. In addition, in this specification and drawing, elements which have substantially the same functional configuration are given the same reference numerals and redundant descriptions thereof are omitted.

<Etching Apparatus>

Figure 2A:
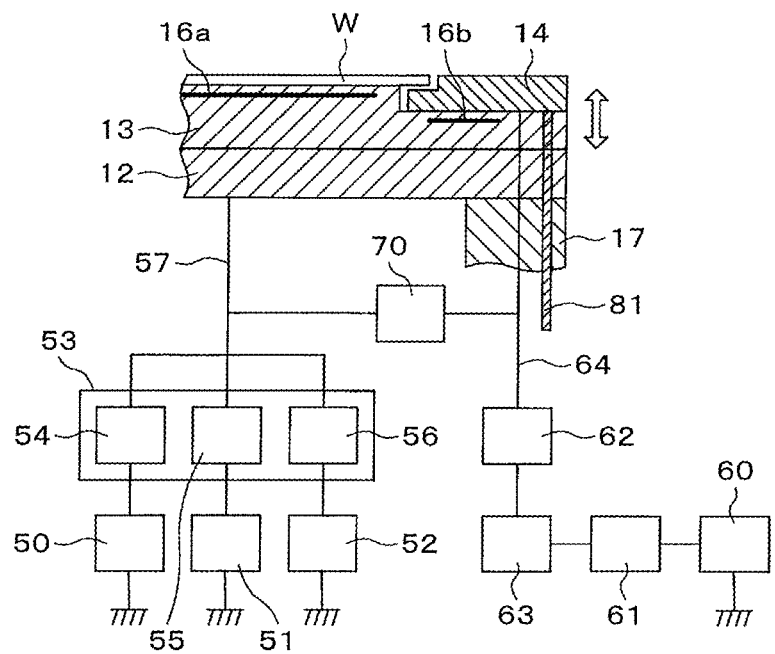
FIG. 2A is a longitudinal sectional view schematically illustrating a configuration of the periphery of an edge ring according to the present embodiment.
Figure 2B:
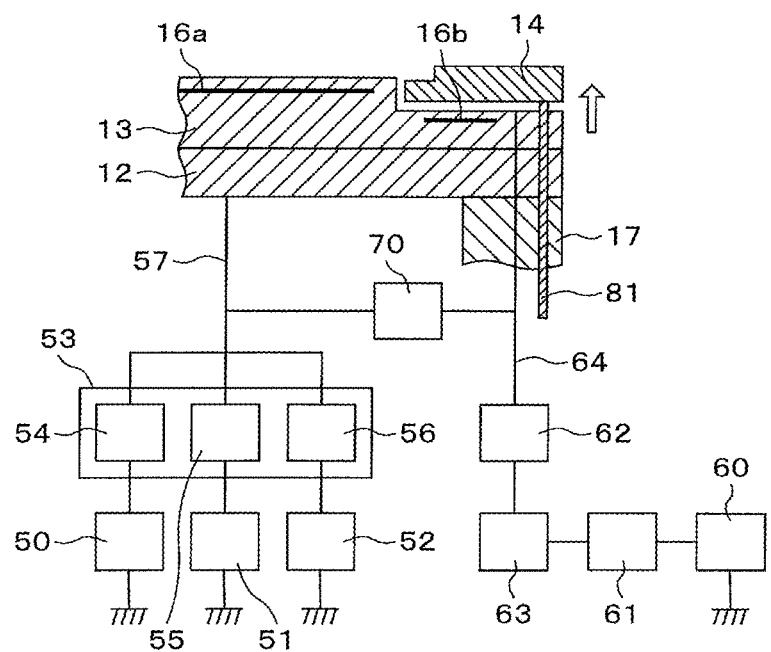
FIG. 2B is a longitudinal sectional view schematically illustrating a configuration of the periphery of an edge ring according to the present embodiment.

First, an etching apparatus according to the present embodiment is described. FIG. 1 is a longitudinal sectional view schematically illustrating a configuration of an etching apparatus 1. FIGS. 2A and 2B are each a longitudinal sectional view schematically illustrating a configuration around an edge ring. The etching apparatus 1 is a capacitively coupled etching apparatus. The etching apparatus 1 performs etching on the wafer W as a substrate.

As illustrated in FIG. 1, the etching apparatus 1 has a substantially cylindrical chamber 10. The chamber 10 defines a processing space S in which plasma is generated. The chamber 10 is formed of, for example, aluminum. The chamber 10 is connected to a ground potential.

A stage 11 as a substrate support on which the wafer W is mounted is accommodated in the chamber 10. The stage 11 has a lower electrode 12, an electrostatic chuck 13, and an edge ring 14. In addition, an electrode plate (not shown) formed of, for example, aluminum may be provided on a lower surface side of the lower electrode 12.

The lower electrode 12 is formed of a conductive material, for example, a metal, such as aluminum, and has a substantially disk shape.

Further, the stage 11 may include a temperature control module configured to control at least one of the electrostatic chuck 13, the edge ring 14, and the wafer W to have a desired temperature. The temperature control module may include a heater, a flow path, or a combination thereof. A temperature control medium, such as a refrigerant or a heat transfer gas, flows through the flow path.

In an example, a flow path 15a is formed inside the lower electrode 12. A temperature control medium is supplied to the flow path 15a from a chiller unit (not shown) provided outside the chamber 10 through an inlet pipe 15b. The temperature control medium supplied to the flow path 15a is returned to the chiller unit via an outlet flow path 15c. By circulating a temperature control medium, for example, a coolant, such as cooling water, in the flow passage 15a, the electrostatic chuck 13, the edge ring 14, and the wafer W may be cooled to have a desired temperature.

The electrostatic chuck 13 is provided on the lower electrode 12. In an example, the electrostatic chuck 13 is a member configured to be able to adsorb and hold both the wafer W and the edge ring 14 by electrostatic force. The electrostatic chuck 13 is formed such that an upper surface at a central portion thereof is higher than an upper surface at a peripheral portion thereof. The upper surface at the central portion of the electrostatic chuck 13 is a wafer supporting surface as a substrate supporting surface for supporting the wafer W, and in an example, the upper surface at the peripheral portion of the electrostatic chuck 13 is an edge ring supporting surface for supporting the edge ring 14. In addition, the lower electrode 12 may be provided inside the electrostatic chuck 13.

In an example, a first electrode 16a for adsorbing and holding the wafer W is provided in the central portion of the electrostatic chuck 13. Inside the electrostatic chuck 13, a second electrode 16b for adsorbing and holding the edge ring 14 is provided at a peripheral portion thereof. The electrostatic chuck 13 has a configuration in which electrodes 16a and 16b are interposed between insulating materials formed of an insulating material.

A DC voltage from a DC power supply (not shown) is applied to the first electrode 16a. The wafer W is adsorbed and held on the upper surface of the central portion of the electrostatic chuck 13 by electrostatic force generated thereby. Similarly, a DC voltage from a DC power supply (not shown) is applied to the second electrode 16b. In an example, the edge ring 14 is adsorbed and held on the upper surface of the periphery portion of the electrostatic chuck 13 by electrostatic force generated thereby.

Further, in the present embodiment, the central portion of the electrostatic chuck 13 provided with the first electrode 16a and the peripheral portion provided with the second electrode 16b are integrated with each other, but these central portions and the peripheral portions may be separately provided. In addition, both of the first electrode 16a and the second electrode 16b may be unipolar electrodes or bipolar electrodes.

In addition, in the present embodiment, the edge ring 14 is electrostatically adsorbed to the electrostatic chuck 13 by applying a DC voltage to the second electrode 16b, but a method of holding the edge ring 14 is limited thereto. For example, the edge ring 14 may be held adsorbed and held using an adsorption sheet, or the edge ring 14 may be clamped to be adsorbed and held. Alternatively, the edge ring 14 may be held by the weight of the edge ring 14.

The edge ring 14 is an annular member disposed to surround the wafer W mounted on the upper surface of the central portion of the electrostatic chuck 13. The edge ring 14 is provided to improve uniformity of etching. For this reason, the edge ring may be formed of a material appropriately selected according to etching, may have conductivity, and may be formed of, for example, Si or SiC.

The stage 11 configured as described above is fastened to a substantially cylindrical support member 17 provided at the bottom of the chamber 10. The supporting member 17 is formed of, for example, an insulator, such as ceramic or quartz.

A shower head 20 is provided above the stage 11 to face the stage 11. The shower head 20 includes an electrode plate 21 disposed to face the processing space S and an electrode support body 22 provided above the electrode plate 21. The electrode plate 21 functions as a pair of upper electrodes with the lower electrode 12. As is described below, when a first high frequency power supply 50 is electrically coupled to the lower electrode 12, the shower head 20 is connected to a ground potential. Further, the shower head 20 is supported on an upper portion (ceiling surface) of the chamber 10 via an insulating shielding member 23.

The electrode plate 21 is provided with a plurality of gas outlets 21a for supplying a processing gas transferred from a gas diffusion chamber 22a to be described below to the processing space S. The electrode plate 21 is formed of, for example, a conductor or semiconductor having a low electrical resistivity with little Joule heat being generated.

The electrode support body 22 detachably supports the electrode plate 21. The electrode support body 22 has a configuration in which a film having plasma resistance is formed on a surface of a conductive material, such as aluminum, for example. This film may be a film formed by anodizing or a film formed of ceramics, such as yttrium oxide. A gas diffusion chamber 22a is formed inside the electrode support body 22. A plurality of gas distribution holes 22b communicating with a gas outlet 21a are formed from the gas diffusion chamber 22a. In addition, the gas diffusion chamber 22a is provided with a gas introduction hole 22c connected to a gas supply pipe 33, which is described below.

Further, a gas source group 30 for supplying a processing gas to the gas diffusion chamber 22a is connected to the electrode support body 22 through a flow control device group 31, a valve group 32, a gas supply pipe 33, the gas introduction hole 22c.

The gas source group 30 has a plurality of types of gas sources necessary for etching. The flow control device group 31 includes a plurality of flow controllers, and the valve group 32 includes a plurality of valves. Each of the plurality of flow controllers in the flow control device group 31 is a mass flow controller or a pressure control type flow controller. In the etching apparatus 1, a processing gas from one or more gas sources selected from the gas source group 30 is supplied to gas diffusion chamber 22a through the flow control device group 31, the valve group 32, the gas supply pipe 33, and the gas introduction hole 22c. Then, the processing gas supplied to the gas diffusion chamber 22a may be dispersed and supplied in a shower shape into the processing space S through the gas distribution hole 22b and the gas outlet 21a.

At the bottom of the chamber 10, a baffle plate 40 is provided between an inner wall of the chamber 10 and the support member 17. The baffle plate 40 is constituted by, for example, coating an aluminum material with ceramics, such as yttrium oxide. A plurality of through holes are formed in the baffle plate 40. The processing space S communicates with an exhaust port 41 via the baffle plate 40. An exhaust device 42, such as a vacuum pump, is connected to the exhaust port 41, and pressure inside the processing space S may be reduced by the exhaust device.

In addition, a carry-in/out port 43 for the wafer W is formed on a sidewall of the chamber 10, and the carry-in/out port 43 may be opened and closed by a gate valve 44.

As illustrated in FIGS. 1, 2A, and 2B, the etching apparatus 1 further includes a first high frequency power supply 50 as a source power supply, a second high frequency power supply 51 as a bias power supply, a third high frequency power supply 52 as a bias power supply, and a matching device 53. The first high frequency power supply 50, the second high frequency power supply 51, and the third high frequency power supply 52 are coupled to the lower electrode 12 through a first matching circuit 54, a second matching circuit 55, and a third matching circuit 56, respectively. Although the first matching circuit 54, the second matching circuit 55, and the third matching circuit 56 are provided inside one matching device 53 in this embodiment, their arrangement is not limited. For example, they may be provided inside separate matching devices or may be provided outside the matching device. Also, the first high frequency power supply 50, the second high frequency power supply 51, and the third high frequency power supply 52 constitute a power supply in the present disclosure. The first high frequency power supply 50 generates first high frequency power HF, which is source RF power (source power) for plasma generation, and supplies the first high frequency power HF to the lower electrode 12. The first high frequency power HF may be a first frequency within the range of 27 MHz to 100 MHz, and in an example, it is 40 MHz. The first high frequency power supply 50 is coupled to the lower electrode 12 through the first matching circuit 54 of the matching device 53. The first matching circuit 54 is a circuit for matching output impedance of the first high frequency power supply 50 with input impedance of a load side (lower electrode 12 side). In addition, the first high frequency power supply 50 may not be electrically coupled to the lower electrode 12, or may be coupled to the shower head 20, that is, an upper electrode, via the first matching circuit 54. Alternatively, instead of the first high frequency power supply 50, a pulsed power supply configured to apply a pulse voltage other than high frequency power to the lower electrode 12 may also be used. This pulsed power supply is similar to a pulsed power supply used instead of the second high frequency power supply 51 and the third high frequency power supply 52 described below.

The second high frequency power supply 51 generates second high frequency power LF1, which is bias RF power (bias power) for attracting ions into the wafer W, and supplies the second high frequency power LF1 to the lower electrode 12. The second high frequency power LF1 may be a second frequency within the range of 100 kHz to 15 MHz, and in an example, it is 400 kHz. The second high frequency power supply 51 is coupled to the lower electrode 12 through the second matching circuit 55 of the matching device 53. The second matching circuit 55 is a circuit for matching output impedance of the second high frequency power supply 51 with input impedance of the load side (lower electrode 12 side).

The third high frequency power supply 52 generates a third high frequency power LF2, which is bias RF power (bias power) for attracting ions into the wafer W, and supplies the third high frequency power LF2 to the lower electrode 12. The third high frequency power LF2 may be a third frequency within the range of 100 kHz to 15 MHz, may be different from the second frequency, and is 13 MHz in an example. The third high frequency power supply 52 is coupled to the lower electrode 12 via the third matching circuit 56 of the matching device 53. The third matching circuit 56 is a circuit for matching output impedance of the third high frequency power supply 52 with input impedance of the load side (lower electrode 12 side).

In addition, instead of the second high frequency power supply 51 and the third high frequency power supply 52, a pulsed power supply configured to apply a pulse voltage other than the high frequency power to the lower electrode 12 may also be used. Here, the pulse voltage is a pulse-like voltage in which the magnitude of the voltage changes periodically. The pulsed power supply may be a DC power supply. The pulsed power supply may be configured to generate a pulse voltage by itself, or may be configured to include a DC power supply and a device (pulse generator) that pulses a voltage on a downstream side of the DC power supply. In an example, the pulse voltage is applied to the lower electrode 12 so that a negative potential is generated in the wafer W. The pulse voltage may have a rectangular wave, a triangular wave, an impulse, or may have any other waveform. A frequency (pulse frequency) of the pulse voltage may be a frequency within the range of 100 kHz to 2 MHz. In addition, the high frequency powers LF1 and LF2 or the pulse voltage may be supplied or applied to a bias electrode provided inside the electrostatic chuck 13.

The etching apparatus 1 further has a DC power supply 60, a switching unit 61, a first RF filter 62, and a second RF filter 63 (corresponding to a third RF filter in the present disclosure). The DC power supply 60 is electrically connected to the edge ring 14 from the DC power supply 60 side via the switching unit 61, the second RF filter 63, and the first RF filter 62. The DC power supply 60 is connected to a ground potential.

The DC power supply 60 is a power source for generating a negative polarity DC voltage applied to the edge ring 14. In addition, the DC power supply 60 is a variable DC power supply, and a height of the DC voltage may be adjusted.

The switching unit 61 is configured to stop application of the DC voltage from the DC power supply 60 to the edge ring 14. In addition, a person skilled in the art may design a circuit configuration of the switching unit 61 appropriately.

The first RF filter 62 and the second RF filter 63 each are filters which attenuate high frequency power. The first RF filter 62 attenuates, for example, the first high frequency power HF of 40 MHz from the first high frequency power supply 50. The second RF filter 63 attenuates, for example, the second high frequency power LF1 of 400 kHz from the second high frequency power supply 51 or the third high frequency power LF2 of 13 MHz from the third high frequency power supply 52.

In an example, the second RF filter 63 is configured to have variable impedance. That is, the second RF filter 63 includes at least one variable passive component and has variable impedance. The variable passive component may be, for example, either a coil (inductor) or a condenser (capacitor). In addition, the variable element is not limited to a coil and a condenser, and any variable impedance element, such as an element of a diode or the like may achieve the same function. The number and position of the variable passive components may also be appropriately designed by those skilled in the art. The element itself does not need to be variable, and for example, a plurality of elements each having a fixed impedance value may be provided and impedance may be varied by switching a combination of the elements having the fixed values using a switching circuit. In addition, a circuit configuration including the second RF filter 63 and a circuit configuration including the first RF filter 62 can be designed appropriately by a person skilled in the art.

The etching apparatus 1 further includes a bypass circuit 70. In an example, the bypass circuit 70 is connected to a path 57 between the matching device 53 and the lower electrode 12 and a path 64 between the second RF filter 63 and the edge ring 14. In addition, the arrangement of the bypass circuit 70 is not limited thereto example. In addition, although the number of the bypass circuits 70 is one in this example, the bypass circuit may also be provided in plurality. A modification of the arrangement of the bypass circuit 70 and a modification of the combination of the bypass circuit 70 are described below.

The bypass circuit 70 bypasses the high frequency power of a specific frequency, thereby increasing the amount of power supplied to the edge ring 14. Specifically, the bypass circuit 70 allows the high frequency power of a frequency to be adjusted for an initial tilt angle, among a group consisting of the first to third high frequency powers HF, LF1, and LF2 of a plurality of frequencies to be controlled for the tilt angle, to selectively pass therethrough. In addition, the bypass circuit 70 adjusts a passage amount of the high frequency power (magnitude of the high frequency power), that is, the amount of power supplied to the edge ring 14.

As described above, the bypass circuit 70 has a frequency selection function and a power passage amount determining function, but the circuit configuration may be arbitrarily designed by a person skilled in the art. In an example, the bypass circuit 70 may include a circuit that blocks passage of high frequency power of a specific frequency, for example, a coil (inductor) in order to achieve a frequency selection function. In addition, the bypass circuit 70 may have an element which determines the passage amount of high frequency power, for example, a condenser (capacitor) in order to achieve the power passage amount determination function.

The etching apparatus 1 further includes a lifting device 80 for lifting and lowering the edge ring 14. The lifting device 80 includes a lifting pin 81 ascending and descending, while supporting the edge ring 14, and a driving source 82 that lifts and lowers the lifting pin 81.

The lifting pin 81 elongates in a vertical direction from a lower surface of the edge ring 14 and is provided through the electrostatic chuck 13, the lower electrode 12, the support member 17, and a bottom of the chamber 10. A space between the lifting pins 81 and the chamber 10 is sealed to seal the inside of the chamber 10. At least the surface of the lifting pin 81 is formed of an insulator.

The driving source 82 is provided outside the chamber 10. The driving source 82 includes, for example, a motor, and lifts and lowers the lifting pin 81. That is, the edge ring 14 may be configured to be lifted and lowered between a state in which the edge ring 14 is mounted on the electrostatic chuck 13 as illustrated in FIG. 2A and a state in which the edge ring 14 is spaced apart from the electrostatic chuck 13 as illustrated in FIG. 2B.

In addition, the etching apparatus 1 may further include a measurement device (not shown) which measures a self-bias voltage of the edge ring 14 (or a self-bias voltage of the lower electrode 12 or the wafer W). In addition, a configuration of the measurement device may be appropriately designed by those skilled in the art.

The above etching apparatus 1 includes the controller 100. The controller 100 is, for example, a computer provided with a CPU or a memory, and has a program storage (not shown). A program for controlling etching in the etching apparatus 1 is stored in the program storage. In addition, the program may be recorded in a computer-readable storage medium or may be installed in the controller 100 from the storage medium. Further, the storage medium may be temporary or non-transitory.

<Etching Method>

Next, etching performed using the etching apparatus 1 configured as described above is described.

First, the wafer W is loaded into the chamber 10, and the wafer W is mounted on the electrostatic chuck 13. Thereafter, by applying a DC voltage to the first electrode 16a of the electrostatic chuck 13, the wafer W is electrostatically adsorbed and held to the electrostatic chuck 13 by the Coulomb force. Further, after the wafer W is loaded, the inside of the chamber 10 is decompressed to a desired degree of vacuum by the exhaust device 42.

Next, a processing gas is supplied from the gas source group 30 through the shower head 20 to the processing space S. In addition, the first high frequency power HF for plasma generation is supplied to the lower electrode 12 by the first high frequency power supply 50, and the processing gas is excited to generate plasma. At this time, the second high frequency power LF1 and the third high frequency power LF2 for attracting ions may also be supplied by the second high frequency power supply 51 and the third high frequency power supply 52. Then, the wafer W is etched by the action of the generated plasma.

When the etching is terminated, first, the supply of the first high frequency power HF from the first high frequency power supply 50 and the supply of the processing gas by the gas source group 30 are stopped. In addition, when the high frequency powers LF1 and LF2 have been supplied during etching, the supply of the high frequency powers LF1 and LF2 is also stopped. Next, the supply of a heat transfer gas to a rear surface of the wafer W is stopped, and the adsorption and holding of the wafer W by the electrostatic chuck 13 is stopped.

Thereafter, the wafer W is unloaded from the chamber 10, and a series of etching on the wafer W is terminated.

In the etching, plasma may be generated using only the second high frequency power LF1 from the second high frequency power supply 51 or only the third high frequency power LF2 from the third high frequency power supply 52.

<Description of Tilt Angle>

A tilt angle is an inclination (angle) of a concave portion formed by etching in the edge region of the wafer W with respect to a thickness direction of the wafer W. The tilt angle is almost the same as an inclination of an incident direction of the ions to the edge region of the wafer W with respect to a vertical direction (incident angle of ions). In addition, in the following description, a radially inner (center side) direction with respect to the thickness direction (vertical direction) of the wafer W is referred to as an inner side, and a radially outer direction with respect to the thickness direction of the wafer W is referred to as an outer side.

Figure 3A:
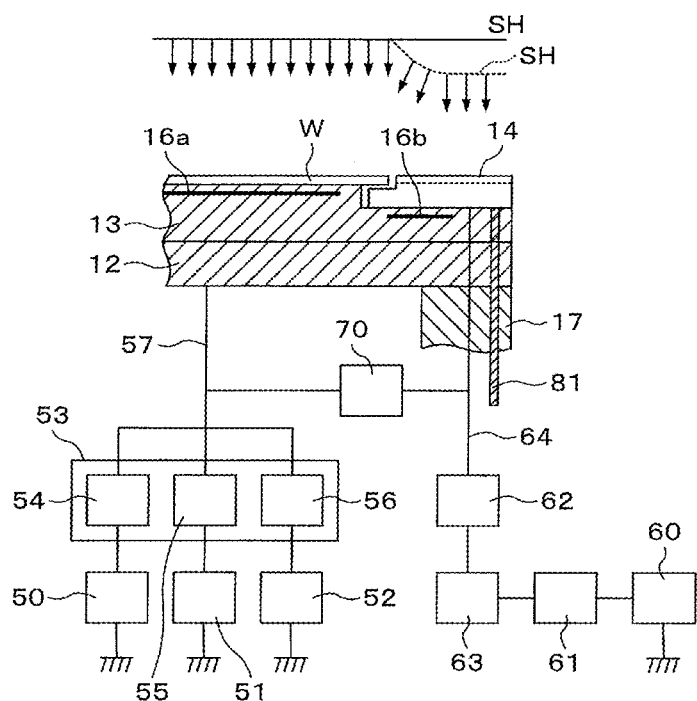
FIG. 3A is a view illustrating a change in a shape of a sheath due to consumption of an edge ring and an occurrence of inclination in a direction of incidence of ions.
Figure 3B:
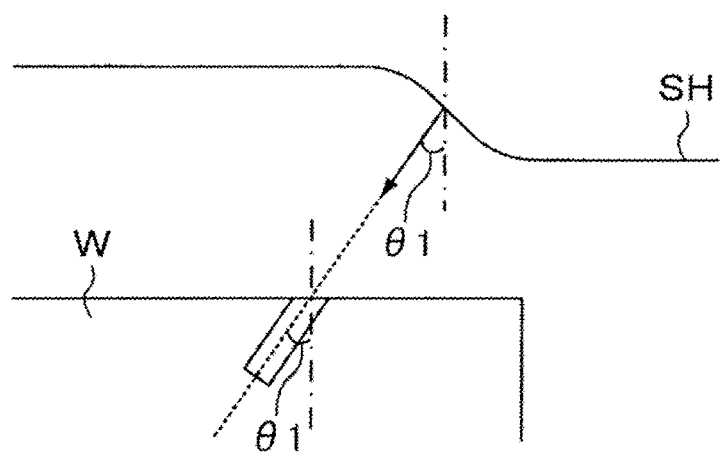
FIG. 3B is a view illustrating a change in a shape of a sheath due to consumption of an edge ring and an occurrence of inclination in a direction of incidence of ions.

FIGS. 3A and 3B are explanatory views illustrating a change in a shape of a sheath due to consumption of an edge ring and the occurrence of inclination in the incident direction of ions. In FIG. 3A, the edge ring 14 indicated by the solid line illustrates the edge ring 14 in a state without the consumption. The edge ring 14 indicated by the dotted line illustrates the edge ring 14 having a reduced thickness due to the consumption. In addition, the sheath SH indicated by the solid line in FIG. 3A illustrates the shape of the sheath SH when the edge ring 14 is not consumed. The sheath SH indicated by the dotted line illustrates the shape of the sheath SH when the edge ring 14 is consumed. In addition, in FIG. 3A, the arrows indicate the incident direction of the ions when the edge ring 14 is consumed.

As illustrated in FIG. 3A, in an example, when the edge ring 14 is not consumed, the shape of the sheath SH is maintained flat above the wafer W and the edge ring 14. Accordingly, ions are incident in a direction (vertical direction) substantially perpendicular to the front surface of the wafer W. Therefore, the tilt angle is 0 degrees.

Meanwhile, when the edge ring 14 is consumed and a thickness thereof decreases, the thickness of the sheath SH decreases above the edge region of the wafer W and the edge ring 14, and the shape of the sheath SH is changed to a downwardly convex shape. As a result, the incident direction of the ions with respect to the edge region of the wafer W is inclined with respect to the vertical direction. In the following description, a phenomenon in which the concave portion formed by etching inclines toward the inner side when the incident direction of ions is inclined to the radially inner side (center side) with respect to the vertical direction is referred to as inner tilt. In FIG. 3B, the incident direction of ions is inclined toward the inner side by an angle θ1, and the concave portion is also inclined toward the inner side by the angle θ1. The cause of inner tilt is not limited to wear of the edge ring 14 described above. For example, when the bias voltage generated in the edge ring 14 is lower than the voltage on the wafer W side, the inner tilt occurs in the initial state. Further, for example, the inner tilt is intentionally set in the initial state of the edge ring 14, and the tilt angle may be corrected by adjusting the driving amount of the lifting device 80, which will be described later.

Figure 4A:
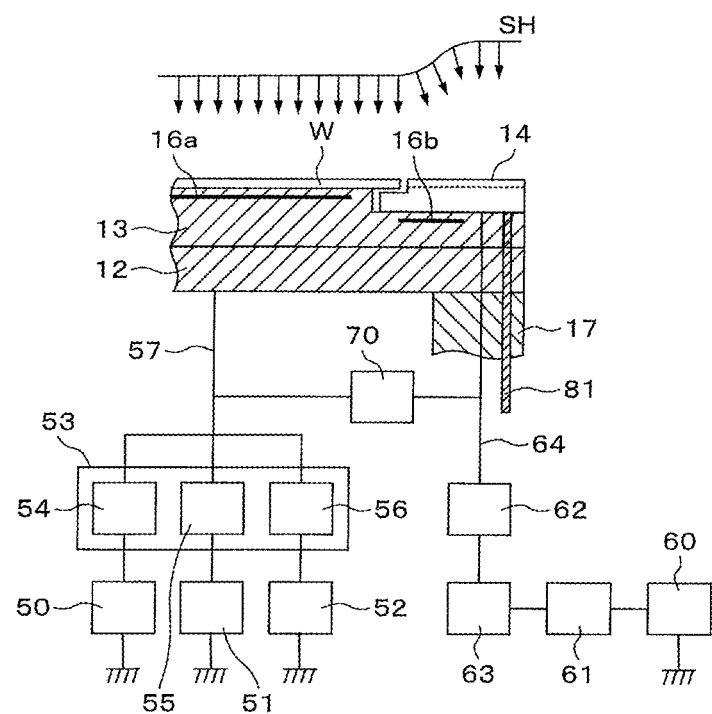
FIG. 4A is an explanatory view illustrating a change in a shape of a sheath and an occurrence of inclination in a direction of incidence of ions.
Figure 4B:
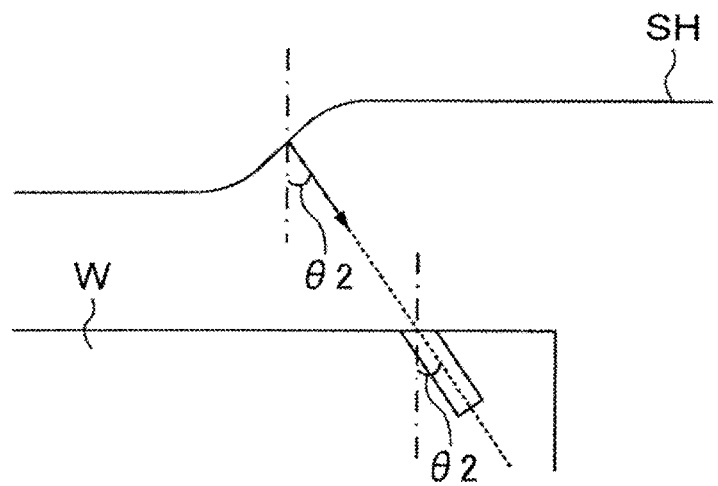
FIG. 4B is an explanatory view illustrating a change in a shape of a sheath and an occurrence of inclination in a direction of incidence of ions.

In addition, as illustrated in FIGS. 4A and 4B, with respect to the central region of the wafer W, the thickness of the sheath SH may increase above the edge region of the wafer W and the edge ring 14, so that the sheath SH may have an upwardly convex shape. For example, when a bias voltage generated in the edge ring 14 is high, the sheath SH may have an upward convex shape. In FIG. 4A, the arrows indicate the incident direction of ions. In the following description, a phenomenon in which the concave portion formed by etching is inclined toward the outer side when the incident direction of ions is inclined radially outwardly with respect to the vertical direction is referred to as outer tilt. In FIG. 4B, the incident direction of ions is inclined toward the outer side by an angle θ2 and the concave portion is also inclined toward the outer side by the angle θ2.

As described above, except for the case illustrated in FIGS. 4A and 4B, when the edge ring 14 is consumed by performing etching, as illustrated in FIGS. 3A and 3B, the tilt angle in the edge region of the wafer W is inclined toward the inner side. Due to this, in an example, the tilt angle is controlled and corrected to the outer side. The tilt angle is controlled by any one or a combination of adjustment of the impedance of the second RF filter 63, adjustment of the DC voltage from the DC power supply 60, and adjustment of the driving amount of the lifting device 80. In the following description, the impedance of the second RF filters 63, the DC voltage from the DC power supply 60, and the driving amount of the lifting device 80 for controlling the tilt angle may be collectively referred to as "tilt control knob". In addition, a specific method of controlling the tilt angle using the tilt control knob is described below.

<Method of Adjusting Initial Tilt Angle>

As described above, when the tilt angle is controlled to the outer side by the tilt control knob, an initial tilt angle in the initial state before etching is set to 0 (zero) degrees or an angle that is slightly inner tilt in the initial state. Also, the initial state is before etching the wafer W, for example, when the etching apparatus 1 is operated or when the etching apparatus 1 is operated after maintenance.

In the related art, adjustment of the initial tilt angle has been performed, for example, by adjusting the thickness of the edge ring 14. Alternatively, the initial tilt angle was adjusted by, for example, changing the material or thickness of the electrostatic chuck 13. That is, the initial tilt angle was adjusted by changing a device configuration (hardware).

Here, when the tilt angle is controlled for each of the first to third high frequency powers HF, LF1, and LF2 of a plurality of frequencies, for example, three frequencies, the thickness of a sheath generated by power supplied to the edge ring 14 is different for each frequency. Then, as illustrated in FIG. 5, an initial tilt angle differs for every first to third frequencies. Hereinafter, the initial tilt angle with respect to the first frequency is referred to as a first initial tilt angle, the initial tilt angle with respect to the second frequency is referred to as a second initial tilt angle, and the initial tilt angle with respect to the third frequency is referred to as a third initial tilt angle. In addition, the vertical axis of FIG. 5 represents a tilt angle, a positive side (upper side) of the tilt angle (Δθ) degree is an outer side, and a negative side (lower side) of the tilt angle Δθ (zero) degree is an inner side. 90 degrees (described in parentheses) of the vertical axis indicates the thickness direction of the wafer W, and Δθ (zero) degrees indicate that there is no inclination from the thickness direction. The horizontal axis in FIG. 5 represents the adjustment amount of the tilt control knob. In FIG. 5, symbols of •, ▲, and ■ indicate first to third initial tilt angles, respectively. In FIG. 5, straight lines elongated from the first to third initial tilt angles schematically represent a state in which the tilt angle is changed by adjusting the tilt control knob, respectively.

In the case in which the first to third initial tilt angles are different for each frequency as described above, the initial tilt angle of another frequency cannot be adjusted only by changing the device configuration as in the related art even if the initial tilt angle of one frequency is adjusted. That is, the entire first to third initial tilt angles cannot be properly adjusted. Further, when the first to third initial tilt angles are different for each frequency, even if the tilt angle is controlled using the tilt control knob, the tilt angle may not be properly controlled, for example, to 0 (zero) degrees.

Therefore, in the etching apparatus 1 of the present embodiment, the initial tilt angle is adjusted for each frequency using the bypass circuit 70. That is, the bypass circuit 70 bypasses the high frequency power of a specific frequency to increase the amount of power supplied to the edge ring 14, thereby adjusting the initial tilt angle in the edge region of the wafer W. Specifically, the bypass circuit 70 allows the high frequency power of the frequency to be adjusted for the initial tilt angle, among the high frequency powers of a plurality of frequencies to be controlled for the tilt angle, to selectively pass therethrough. In addition, the bypass circuit 70 adjusts the passage amount of the high frequency power, that is, the amount of power supplied to the edge ring 14.

For example, in the example illustrated in FIG. 5, the first to third initial tilt angles are different from each other, and the second initial tilt angle and the third initial tilt angle are to be adjusted. In this case, the second high frequency power LF1 and the third high frequency power LF2, among the first to third high frequency powers HF, LF1 and LF2, are allowed to pass through the edge ring 14 by the bypass circuit 70. At this time, the passage amount of the second high frequency power LF1 and the passage amount of the third high frequency power LF2 are set to the passage amounts according to an adjustment width of the initial tilt angle. Then, the supply amounts of the second high frequency power LF1 and the third high frequency power LF2 supplied to the edge ring 14 increase, so that the second tilt angle and the third initial tilt angle are adjusted to the outer side as illustrated in FIG. 6. In addition, the first to third initial tilt angles may be adjusted to be substantially the same.

As described above, in the present embodiment, at the initial state, such as when the etching apparatus 1 is manufactured or when the etching apparatus 1 is adjusted, the first to third initial tilt angles may be independently adjusted using the bypass circuit 70, and thus, these first to third initial tilt angles may be adjusted to be substantially the same. As a result, when etching is performed thereafter, the tilt angle for each of the first to third frequencies may be appropriately adjusted to, for example, 0 (zero) degrees by adjusting the tilt control knob.

In addition, when the first to third initial tilt angles are adjusted in the initial state, the first to third initial tilt angles are basically not changed in subsequent etching. Further, according to the present embodiment, in the initial state, since the first to third initial tilt angles are adjusted using the bypass circuit 70 different from the tilt control knob, a control range of the tilt angle may be widened by the tilt control knob.

FIG. 7 is an explanatory view illustrating the effect of widening a control range of a tilt angle, in which (a) illustrates a control range of a tilt angle in Comparative Example and (b) illustrates a control range of a tilt angle in the example of the present embodiment. That is, (a) of FIG. 7 corresponds to the tilt angle illustrated in FIG. 5, and (b) of FIG. 7 corresponds to the tilt angle illustrated in FIG. 6. In addition, in FIG. 7, the dotted line represents a control range of a tilt angle by a tilt control knob. Meanwhile, the solid line in which both ends are indicated by circles is a control range of a tilt angle in which the final tilt angle is within an allowable range, in other words, a control range of a tilt angle that may be actually used.

As illustrated in (a) of FIG. 7, in Comparative Example, the first to third initial tilt angles are not individually adjusted, and the first to third initial tilt angles are different. In this case, since the second initial tilt angle is shifted to the inner side, the actually usable control range of the tilt angle (solid line) with respect to the control range of the tilt angle by the tilt control knob (dashed line) is narrowed. In addition, since the third initial tilt angle is shifted to the inner side further than the second tilt angle, the actually usable control range (solid line) of the tilt angle is further narrowed. As described above, since the first to third initial tilt angles are not properly adjusted, the control range of the tilt angle is narrowed, and the effect of controlling the tilt angle by the tilt control knob is reduced.

In contrast, as illustrated in (b) of FIG. 7B, in an embodiment, the first to third initial tilt angles are adjusted to be substantially the same using the bypass circuit 70. That is, adjustment of the initial tilt angle may be performed using only the bypass circuit 70, and subsequent control of the tilt angle may be performed using only the tilt control knob. In this case, since the second initial tilt angle is shifted to the outer side and adjusted to a desired angle, the actually usable control range (solid line) of the tilt angle may be widened. In addition, since the third initial tilt angle is shifted to the outer side further than the second tilt angle and adjusted to a desired angle, the actually usable control range (solid line) of the tilt angle may be further widened. As described above, in the embodiment, the control range of the tilt angle may be widened by maximizing the control range of the tilt angle by the tilt control knob.

In addition, in the present embodiment, only the tilt angles for all the first to third high frequency powers HF, LF1, and LF2, among the first to third high frequency powers HF, LF1, and LF2 of three frequencies, are controlled, but the number of control targets is not limited thereto. For example, the disclosed technology may be applied even to a case in which a tilt angle for high frequency powers of two frequencies is a control target. In other words, when a tilt angle for high frequency powers of two or more frequencies is a control target, the disclosed technology is useful.

In addition, even when a tilt angle with respect to a high frequency power of one frequency is a control target, the technique of the present disclosure is applicable. In the related art, the initial tilt angle has been adjusted by changing the device configuration as described above. However, in the present embodiment, the initial tilt angle is adjusted using the bypass circuit 70, and thus, the initial tilt angle may be easily adjusted.

<Variation of Bypass Circuit>

Next, variations in the arrangement and combination of bypass circuits are described.

[Arrangement of Bypass Circuit]

In the above embodiment, as illustrated in FIG. 2A, the bypass circuit 70 is connected to the path 57 between the matching device 53 and the lower electrode 12 and the path 64 between the second RF filter 63 and the edge ring 14, but the arrangement of the bypass circuit 70 is not limited thereto. The bypass circuit 70 is connected to the same position as the matching device 53 or to the path 57 between the matching device 53 and the lower electrode 12. The reason for locating the bypass circuit 70 in this way is to include a downstream side of the bypass circuit 70 in a matching range. The bypass circuit 70 is also connected to the RF filters 62 and 63 or to the path 64 between the RF filters 62 and 63 and the edge ring 14.

Figure 8A:
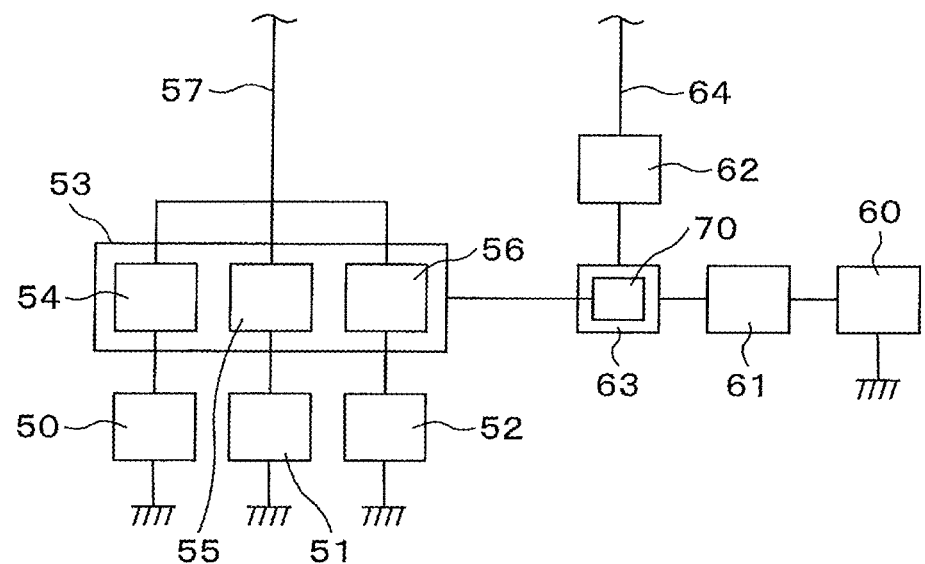
FIG. 8A is explanatory view illustrating an example of an arrangement of a bypass circuit.
Figure 8B:
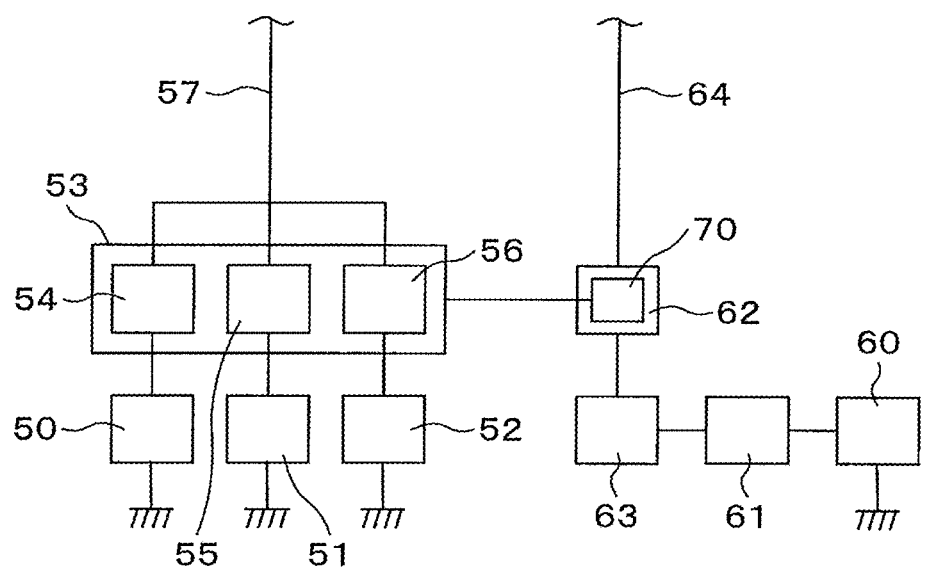
FIG. 8B is an explanatory view illustrating an example of an arrangement of a bypass circuit.

For example, as illustrated in FIG. 8A, the bypass circuit 70 may be provided inside the second RF filter 63. Further, for example, as illustrated in FIG. 8B, the bypass circuit 70 may be provided inside the first RF filter 62. In addition, although not illustrated, the bypass circuit 70 may be provided inside the matching device 53. Furthermore, although not shown, the bypass circuit 70 may be connected to the matching device 53 and the second RF filter 63 or may be connected to the matching device 53 and the DC power supply 60. As such, the bypass circuit 70 is not dependent on the arrangement.

[Combination of Bypass Circuit]

In the above embodiment, as illustrated in FIG. 2A, the bypass circuit 70 is provided in common for the first to third high frequency powers HF, LF1, and LF2 of a plurality of frequencies, but a combination of the bypass circuit 70 is not limited thereto. For example, the bypass circuit 70 may be independently provided for each of the first to third high frequency powers HF, LF1, and LF2 of three frequencies. Also, for example, the bypass circuit 70 does not need to be provided in all of the first to third high frequency powers HF, LF1, and LF2 to be controlled for the tilt angle. For example, for high frequency powers of some frequencies, the initial tilt angle may be adjusted by using the bypass circuit 70, and for high frequency powers of other frequencies, and the initial tilt angle may be adjusted by changing the device configuration as in the related art. Alternatively, one bypass circuit 70 may be provided for high frequency powers of two or more frequencies. When these frequencies are close, it is not necessary to provide a plurality of bypass circuits 70. The combination of these bypass circuits 70 is arbitrary.

Figure 9A:
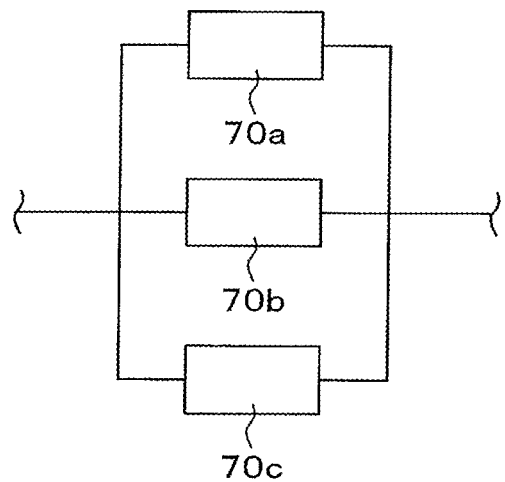
FIG. 9A is an explanatory view illustrating a configuration example of an arrangement of a bypass circuit.
Figure 9B:
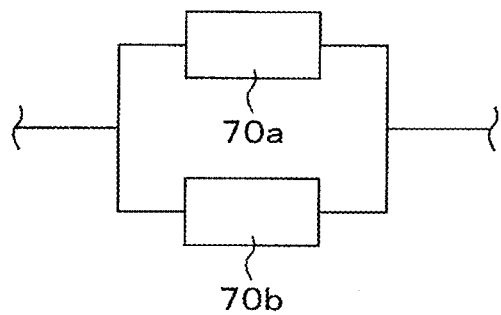
FIG. 9B is an explanatory view illustrating a configuration example of an arrangement of a bypass circuit.
Figure 9C:
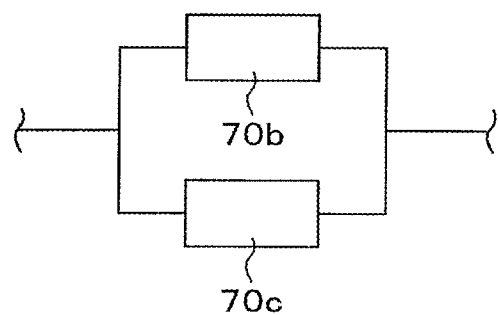
FIG. 9C is an explanatory view illustrating a configuration example of an arrangement of a bypass circuit.

For example, as illustrated in FIG. 9A, a bypass circuit 70a allowing the first high frequency power HF to pass therethrough, a bypass circuit 70b allowing the second high frequency power LF1 to pass therethrough, and a bypass circuit 70c allowing the third high frequency power LF2 to pass therethrough may be provided. This is a case in which all of the first to third initial tilt angles are adjusted. Moreover, as illustrated in FIG. 9B, only the bypass circuit 70a allowing the first high frequency power HF to pass therethrough and the bypass circuit 70b allowing the second high frequency power LF1 to pass therethrough may be provided. This is a case of adjusting the first initial tilt angle and the second initial tilt angle. Alternatively, as illustrated in FIG. 9C, only the bypass circuit 70b allowing the second high frequency power LF1 to pass therethrough and the bypass circuit 70c allowing the third high frequency power LF2 to pass therethrough may be provided. This is a case of adjusting the second initial tilt angle and the third initial tilt angle.

Figure 9D:
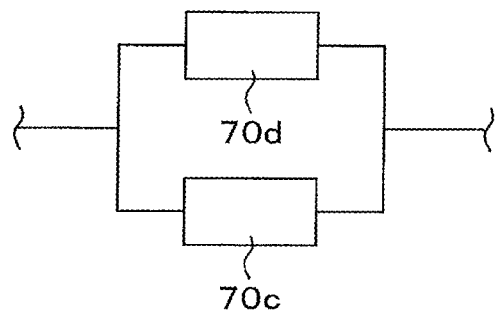
FIG. 9D is an explanatory view illustrating a configuration example of an arrangement of a bypass circuit.
Figure 9E:
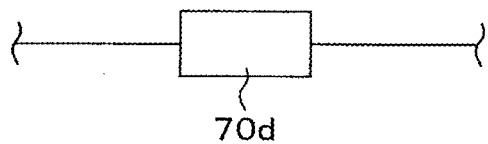
FIG. 9E is an explanatory view illustrating a configuration example of an arrangement of a bypass circuit.
Figure 9F:
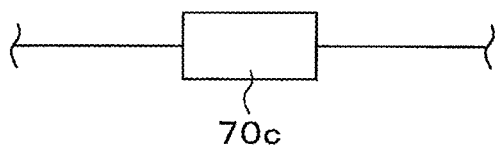
FIG. 9F is an explanatory view illustrating a configuration example of the arrangement of a bypass circuit.

For example, as illustrated in FIG. 9D, a bypass circuit 70d allowing the first high frequency power HF and the second high frequency power LF1 to pass therethrough and a bypass circuit 70c allowing the third high frequency power LF2 to pass therethrough may be provided. The bypass circuit 70d adjusts the first initial tilt angle and the second initial tilt angle. In addition, as illustrated in FIG. 9E, only the bypass circuit 70d allowing the first high frequency power HF and the second high frequency power LF1 to pass therethrough may be provided. Alternatively, only the bypass circuit 70c allowing the third high frequency power LF2 to pass therethrough may be provided.

<Tilt Angle Control Method>

Next, with respect to the etching described above, a method of controlling a tilt angle using the tilt control knob is described. The tilt control knob is any one or a combination of the adjustment of the impedance of the second RF filter 63, the adjustment of the DC voltage from the DC power supply 60, and the driving amount of the lifting device 80, that is, the following (1) to (7). Also, the tilt angle is controlled by controlling an incident angle of the ions using the tilt control knob.

Figure 10:
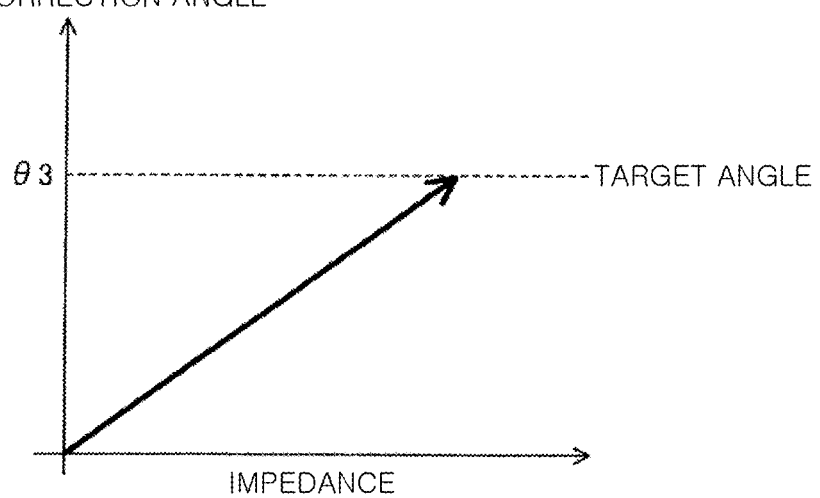
FIG. 10 is an explanatory view illustrating an example of a control method of a tilt angle.

(1) Adjustment of impedance
(2) Adjustment of DC voltage
(3) Adjustment of driving amount
(4) Adjustment of impedance and DC voltage
(5) Adjustment of impedance and driving amount
(6) Adjustment of DC voltage and driving amount
(7) Adjustment of impedance, DC voltage, and driving amount (1) Adjustment of Impedance A case of adjusting the impedance of the second RF filter 63 is described. FIG. 10 is an explanatory view illustrating a relationship between the impedance of the second RF filter 63 and a tilt angle correction angle (hereinafter, referred to as "tilt correction angle"). In FIG. 10, the vertical axis represents the tilt correction angle and the horizontal axis represents the impedance of the second RF filter 63. As illustrated in FIG. 10, as the impedance of the second RF filter 63 increases, the tilt correction angle increases. In the example illustrated in FIG. 10, the tilt correction angle is increased by increasing the impedance, but it is also possible to reduce the tilt correction angle by increasing the impedance by the configuration of the second RF filter 63. The relationship between the impedance and the tilt correction angle depends on the design of the second RF filter 63, and thus is not limited.

The controller 100 sets the impedance of the second RF filter 63 by a consumption amount (a reduction amount from an initial value of the thickness of the edge ring 14) of the edge ring 14 estimated from a process condition (e.g., a processing time) of etching using a predetermined function or table. That is, the controller 100 determines the impedance of the second RF filter 63 by inputting the consumption amount of the edge ring 14 into the function or referring to the table using the consumption amount of the edge ring 14. Then, the controller 100 changes a voltage generated in the edge ring 14 by changing the impedance of the second RF filter 63.

In addition, the consumption amount of the edge ring 14 may be estimated based on an etching time of the wafer W, the number of processed wafers W, the thickness of the edge ring 14 measured by a measurement device, a change in mass of the edge ring 14 measured by a measurement device, a change in electrical characteristics (e.g., a voltage or current value of a certain point near the edge ring 14) near the edge ring 14 measured by a measurement device, or a change in electrical characteristics (e.g., a resistance value of the edge ring 14) of the edge ring 14 measured by a measurement device. In addition, the impedance of the second RF filter 63 may be adjusted according to an etching time of the wafer W or the number of processed wafers W, regardless of the consumption amount of the edge ring 14. In addition, the impedance of the second RF filter 63 may be adjusted according to an etching time of the wafer weighted by the high frequency power or the number of processed wafers W.

A detailed method of controlling the tilt angle by adjusting the impedance of the second RF filter 63 as described above is described. First, the edge ring 14 is installed on the electrostatic chuck 13. At this time, for example, above the edge region of the wafer W and the edge ring 14, the sheath shape is flat and the tilt angle is 0 (zero) degree.

Next, etching is performed on the wafer W. With the lapse of time during which etching is performed, the edge ring 14 is consumed and a thickness thereof decreases. Then, as illustrated in FIG. 3A, above the edge region of the wafer W and the edge ring 14, the thickness of the sheath SH is reduced, and the tilt angle changes to the inner side.

Therefore, the impedance of the second FR filter 63 is adjusted. Specifically, the impedance of the second RF filter 63 is adjusted according to the consumption amount of the edge ring 14. Then, as illustrated in FIG. 10, the tilt correction angle increases, and the tilt angle inclined toward the inner side may be changed to the outer side. That is, the shape of the sheath is controlled above the edge ring 14 and the edge region of the wafer W, the inclination of the incident direction of ions to the edge region of the wafer W is reduced, and the tilt angle is controlled. Also, as described above, when the controller 100 adjusts the second RF filter 63 to the set impedance, the tilt angle may be corrected to 0 (zero) degrees by adjusting the tilt correction angle to the target angle θ3. As a result, a concave portion substantially parallel to the thickness direction of the wafer W is formed over the entire area of the wafer W.

(2) Adjustment of DC Voltage

Figure 11:
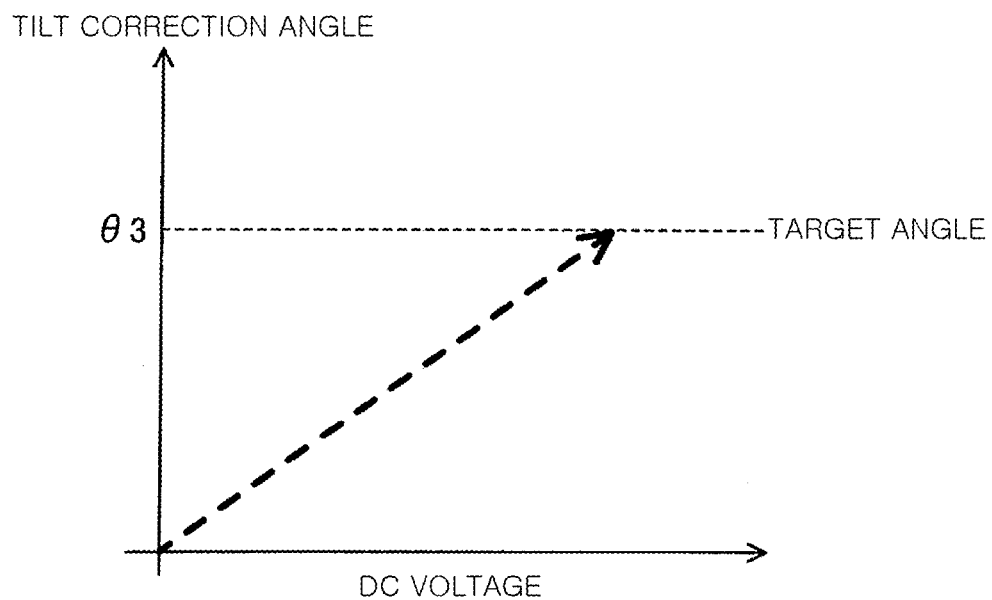
FIG. 11 is an explanatory view illustrating an example of a control method of a tilt angle.

A case of adjusting the DC voltage from the DC power supply 60 is described. FIG. 11 is an explanatory view illustrating a relationship between a DC voltage from the DC power supply 60 and a tilt correction angle. In FIG. 11, the vertical axis represents a tilt correction angle and the horizontal axis represents the DC voltage from the DC power supply 60. As illustrated in FIG. 11, as the DC voltage from the DC power supply 60 increases, the tilt correction angle increases.

In the DC power supply 60, the DC voltage applied to the edge ring 14 is set to a voltage of a negative polarity, i.e., −(|Vdc|+ΔV) having the sum of the self-bias voltage Vdc and a set value ΔV, as an absolute value. The self-bias voltage Vdc is a self-bias voltage of the wafer W, and also, is a self-bias voltage of the lower electrode 12 when one or both of the high frequency powers have been supplied and when the DC voltage from the DC power supply 60 is not applied to the lower electrode 12. The set value ΔV is provided by the controller 100.

The controller 100 sets the DC voltage from the DC power supply 60 from the consumption amount of the edge ring 14, similarly to the setting of the impedance of the second RF filter 63 described above. That is, the set value ΔV is determined.

In determining the set value ΔV, the controller 100 may use a difference between an initial thickness of the edge ring 14 and a thickness of the edge ring 14 actually measured using a measurement device, such as a laser measurement device or a camera, for example, as the consumption amount of the edge ring 14. Alternatively, the consumption amount of the edge ring 14 may be estimated from a change in the mass of the edge ring 14 measured by a measuring device such as a mass meter. Alternatively, the controller 100 may estimate the consumption amount of the edge ring 14 from a specific parameter using another predetermined function or table to determine the set value ΔV. This specific parameter may be any one of the self-bias voltage Vdc, a peak value Vpp of any one of the first to third high frequency powers HF, LF1, and LF2, load impedance, the edge ring 14, or electrical characteristics of the periphery of the edge ring 14. The edge ring 14 or the electrical characteristics of the periphery of the edge ring 14 may be any one of a voltage, a current value at the edge ring 14 or any location around the edge ring 14, and a resistance value including the edge ring 14. Another function or table is predefined to determine a relationship between a specific parameter and the consumption amount of the edge ring 14. In order to estimate the consumption amount of the edge ring 14, before the actual execution of etching or during maintenance of the etching apparatus 1, the etching device 1 is operated under measurement conditions for estimating the consumption amount, that is, under the setting of the first high frequency power HF, the second high frequency power LF1, the third high frequency power LF2, the pressure in the processing space S, and a flow rate of the processing gas supplied to the processing space S. Then, the specific parameter is acquired, and the consumption amount of the edge ring 14 is specified by inputting the specific parameter into the other function or referring to the table using the specific parameter.

In the etching apparatus 1, during etching, that is, during a period in which any one of the first to third high frequency powers HF, LF1, and LF2 or a plurality of high frequency powers is supplied, a DC voltage is applied from the DC power 60 to the edge ring 14. Thereby, the shape of the sheath above the edge ring 14 and the edge region of the wafer W is controlled so that inclination of the incident direction of ions to the edge region of the wafer W is reduced and the tilt angle is controlled. As a result, a concave portion substantially parallel to the thickness direction of the wafer W is formed over the entire area of the wafer W.

More specifically, during etching, the self-bias voltage Vdc is measured by a measurement device (not shown). Further, a DC voltage is applied to the edge ring 14 from the DC power supply 60. A value of the DC voltage applied to the edge ring 14 is −(|Vdc|+ΔV) as described above. |Vdc| is an absolute value of the measured value of the self-bias voltage Vdc acquired by the measurement device immediately before, and ΔV is a set value determined by the controller 100. In this way, the DC voltage applied to the edge ring 14 from the self-bias voltage Vdc measured during etching is determined. Then, even if a change occurs in the self-bias voltage Vdc, the DC voltage generated by the DC power supply 60 is corrected, and the tilt angle is appropriately corrected.

In the etching apparatus 1, when the edge ring 14 is consumed, the DC voltage set by the controller 100 is applied from the DC power supply 60 to the edge ring 14. Thereby, the shape of the sheath above the edge ring 14 and the edge region of the wafer W is controlled and the inclination of the incident direction of ions to the edge region of the wafer W is reduced, so that the tilt angle is controlled. Then, as illustrated in FIG. 11, a tilt correction angle may be adjusted to a target angle θ3, and the tilt angle may be adjusted to 0 degrees.

(3) Adjustment of Driving Amount

Figure 12:
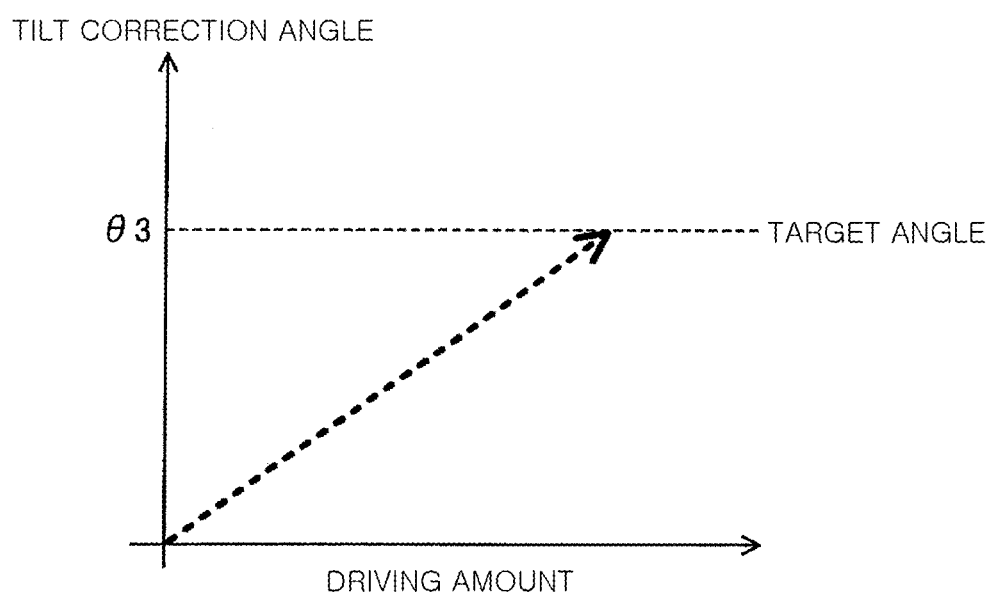
FIG. 12 is an explanatory view illustrating an example of a control method of a tilt angle.

The case of adjusting the driving amount of the lifting device 80 is described. FIG. 12 is an explanatory view illustrating a relationship between a driving amount of the lifting device 80 and a tilt correction angle. In FIG. 12, the vertical axis represents the tilt correction angle and the horizontal axis represents the driving amount of the lifting device 80. As illustrated in FIG. 12, when the driving amount of the lifting device 80 increases, the tilt correction angle increases.

The controller 100 sets the driving amount of the lifting device 80 from the consumption amount of the edge ring 14, similarly to the setting of the impedance of the second RF filter 63 described above. Also, for example, the driving amount of the lifting device 80 is increased according to the consumption amount of the edge ring 14, to lift the edge ring 14.

In the etching apparatus 1, when the edge ring 14 is consumed, the edge ring 14 is lifted based on the driving amount set by the controller 100. Thereby, the shape of the sheath above the edge ring 14 and the edge region of the wafer W is controlled and the inclination of the incident direction of ions to the edge region of the wafer W is reduced, thereby controlling the tilt angle. In this way, as illustrated in FIG. 12, the tilt correction angle may be adjusted to the target angle θ3, and the tilt angle may be set to 0 (zero) degrees.

(4) Adjustment of Impedance and DC Voltage

Figure 13:
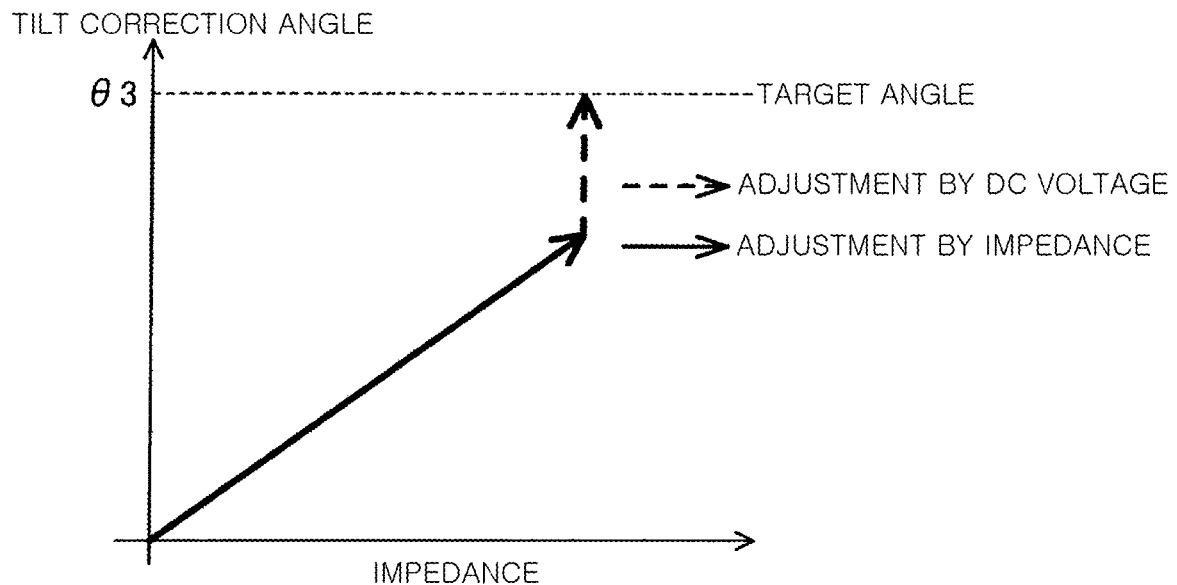
FIG. 13 is an explanatory view illustrating an example of a control method of a tilt angle.

The case in which the impedance of the second RF filter 63 and the DC voltage from the DC power supply 60 are combined and adjusted is described. FIG. 13 is an explanatory view illustrating a relationship among the impedance of the second RF filter 63, the DC voltage from the DC power supply 60, and a tilt correction angle. In FIG. 13, the vertical axis represents the tilt correction angle, and the horizontal axis represents the impedance of the second RF filter 63.

As illustrated in FIG. 13, first, the impedance of the second RF filter 63 is adjusted, and a tilt angle is corrected. Next, when the impedance reaches a predetermined value, for example, an upper limit value, the DC voltage from the DC power supply 60 is adjusted and the tilt correction angle is adjusted to the target angle θ3, and the tilt angle is set to 0 (zero). In this case, the number of times of adjustment of the impedance and adjustment of the DC voltage may be reduced, thereby simplifying the operation of the tilt angle control.

Here, resolution of the tilt angle correction by the adjustment of the impedance and resolution of the tilt angle correction by the adjustment of the DC voltage depend on the performance of the second RF filter 63 and the DC power supply 60. The resolution of the tilt angle correction is the amount of correction of the tilt angle in one adjustment of the impedance or the DC voltage. Also, for example, when the resolution of the second RF filter 63 is higher than that of the DC power supply 60, in the present embodiment, since the tilt angle of corrected by adjusting the impedance of the second RF filter 63, the resolution of the overall tilt angle correction may be improved.

As described above, the adjustment range of the tilt angle may be enlarged by adjusting the impedance of the second RF filter 63 and adjusting the DC voltage from the DC power supply 60. Therefore, the tilt angle may be appropriately controlled, that is, the incident direction of ions may be appropriately adjusted, and thus, etching may be performed uniformly.

Figure 14:
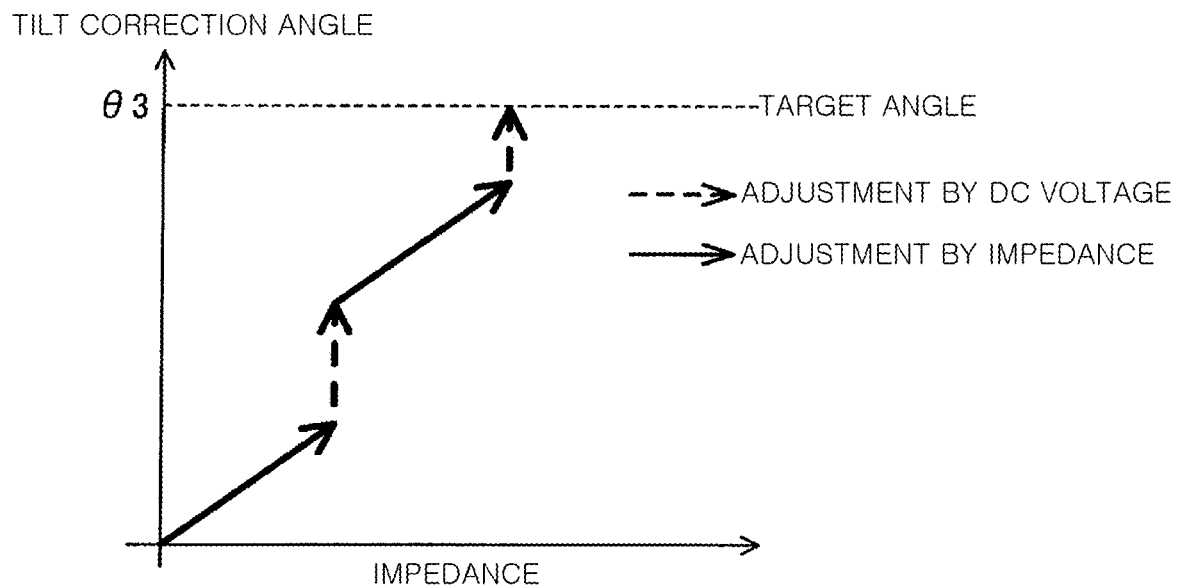
FIG. 14 is an explanatory view illustrating an example of a control method of a tilt angle.

In the example illustrated in FIG. 13, the adjustment of the impedance and the adjustment of the DC voltage are performed once to adjust the tilt correction angle to the target angle θ3, but the number of the adjustment of the impedance and the adjustment of the DC voltage are not limited thereto. For example, as illustrated in FIG. 14, the adjustment of the impedance and the adjustment of the DC voltage may be performed a plurality of times. Even in such a case, the effect similar to that of the present embodiment may be achieved.

In addition, in the example illustrated in FIG. 13 and FIG. 14, after the impedance of the second RF filter 63 is adjusted, the DC voltage from the DC power supply 60 is adjusted, but this order may be reversed. In this case, first, the tilt angle is corrected by adjusting the DC voltage from the DC power supply 60. At this time, if an absolute value of the DC voltage is too high, a discharge may occur between the wafer W and the edge ring 14. Therefore, there is a limit to the DC voltage that may be applied to the edge ring 14. Thus, when the DC voltage reaches a predetermined value, for example, an upper limit value afterwards, the tilt correction angle is adjusted to the target angle θ3 by adjusting the impedance of the second RF filter 63, and the tilt angle is set to 0 (zero) degrees. Also in such a case, the effect similar to that of the present embodiment may be achieved.

In addition, in the above embodiment, although the adjustment of the impedance of the second RF filter 63 and the adjustment of the DC voltage from the DC power supply 60 are performed separately, the adjustment of the impedance and the adjustment of the DC voltage may be performed simultaneously.

(5) Adjustment of Impedance and Driving Amount

Figure 15:
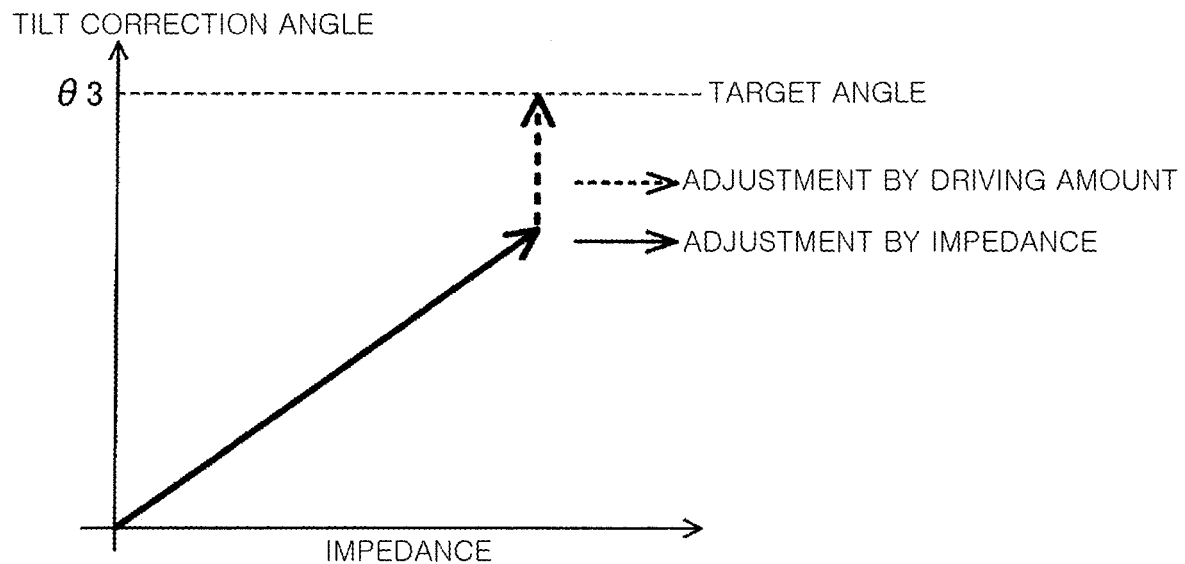
FIG. 15 is an explanatory view illustrating an example of a control method of a tilt angle.

A case in which the impedance of the second RF filter 63 and the driving amount of the lifting device 80 are combined and adjusted is described. FIG. 15 is an explanatory view illustrating a relationship among the impedance of the second RF filter 63, the driving amount of the lifting device 80, and the tilt correction angle. In FIG. 15, the vertical axis represents the tilt correction angle and the horizontal axis represents the impedance of the second RF filter 63.

As illustrated in FIG. 15, first, the tilt angle is corrected by adjusting the impedance of the second RF filter 63. Next, when the impedance reaches a predetermined value, for example, an upper limit value, the tilt correction angle is adjusted to the target angle θ3 and the tilt angle is set to 0 (zero) degree by adjusting the driving amount of the lifting device 80.

Further, the adjustment of the impedance and the adjustment of the driving amount may be performed a plurality of times. In addition, after correcting the tilt angle by adjusting the driving amount, the tilt correction angle may be adjusted to the target angle θ3 by adjusting the impedance. Alternatively, the adjustment of the impedance and the adjustment of the driving amount may be performed simultaneously.

(6) Adjustment of DC Voltage and Driving Amount

Figure 16:
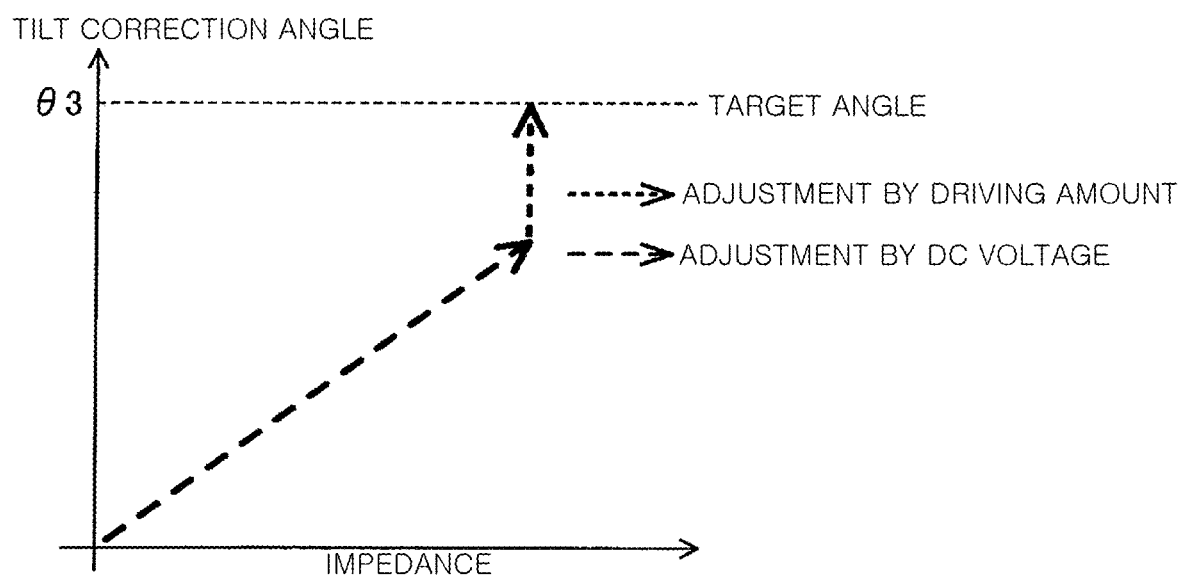
FIG. 16 is an explanatory view illustrating an example of a control method of a tilt angle.

A case in which the DC voltage from the DC power supply 60 and the impedance of the second RF filter 63 are combined and adjusted is described. FIG. 16 is an explanatory view illustrating a relationship among the DC voltage from the DC power supply 60, the driving amount of the lifting device 80, and the tilt correction angle. In FIG. 16, the vertical axis represents the tilt correction angle and the horizontal axis represents the DC voltage from the DC power supply 60.

As illustrated in FIG. 16, first, the DC voltage from the DC power supply 60 is adjusted to correct the tilt angle. Next, when the DC voltage reaches a predetermined value, for example, an upper limit value, the driving amount of the lifting device 80 is adjusted to adjust the tilt correction angle to the target angle θ3, and the tilt angle is set to 0 (zero).

Further, the adjustment of the DC voltage and the adjustment of the driving amount may be performed a plurality of times. In addition, after correcting the tilt angle by adjusting the driving amount, the tilt correction angle may be adjusted to the target angle θ3 by adjusting the DC voltage. Alternatively, the adjustment of the DC voltage and the adjustment of the driving amount may be performed simultaneously.

(7) Adjustment of Impedance, DC Voltage, and Driving Amount

Figure 17:
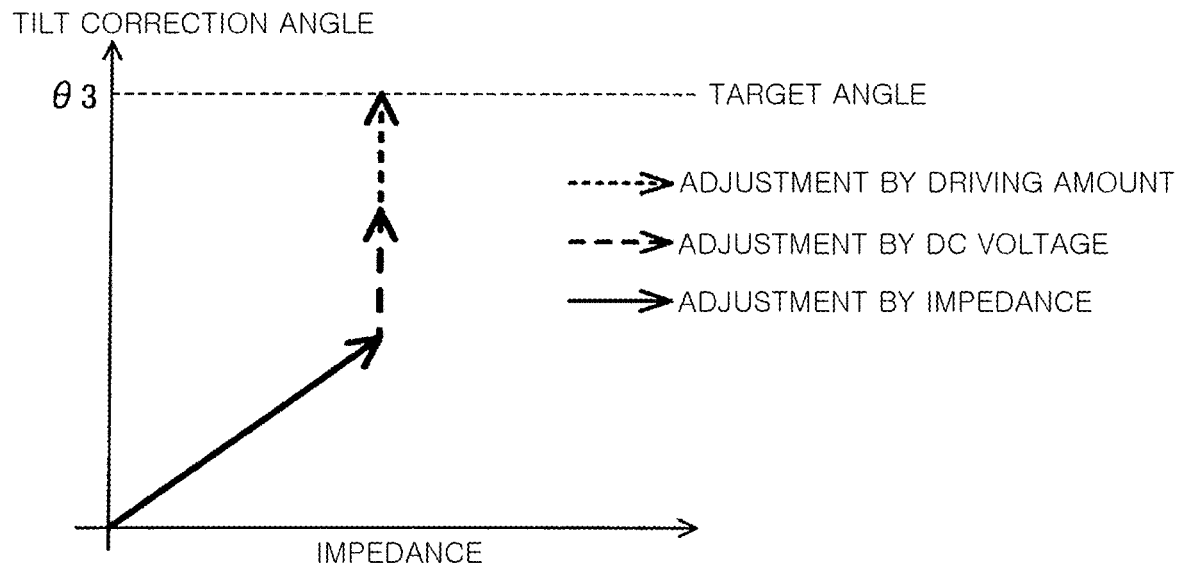
FIG. 17 is an explanatory view illustrating an example of a control method of a tilt angle.

The case in which the impedance of the second RF filter 63, the DC voltage from the DC power supply 60, and the driving amount of the lifting device 80 are combined and adjusted is described. FIG. 17 is an explanatory view illustrating a relationship among the impedance of the second RF filter 63, the DC voltage from the DC power supply 60, the driving amount of the lifting device 80, and the tilt correction angle. The vertical axis of FIG. 17 indicates the tilt correction angle and the horizontal axis represents the impedance of the second RF filter 63.

As illustrated in FIG. 17, first, a tilt angle is corrected by adjusting the impedance of the second RF filter 63. Next, when the impedance reaches a predetermined value, for example, an upper limit value, the tilt angle is corrected by adjusting the DC voltage from the DC power supply 60. In addition, when an absolute value of the DC voltage reaches a predetermined value, for example, an upper limit value, a tilt correction angle is adjusted to the target angle θ3 by adjusting the driving amount of the lifting device 80, and the tilt angle is set to 0 (zero) road.

In addition, when controlling the tilt angle, the combination of the adjustment of the impedance of the second RF filter 63, the DC voltage from the DC power supply 60, and the adjustment of the driving amount of the lifting device 80 may be arbitrarily designed. In addition, although the adjustment of the impedance of the second RF filter 63, the DC voltage from the DC power supply 60, and the adjustment of the driving amount of the lifting device 80 are separately performed, these adjustments may be performed simultaneously.

In addition, although the DC power supply 60 is connected to the edge ring 14 via the switching unit 61, the first RF filter 62, and the second RF filter 63, a power system applying a DC voltage to the edge ring 14 is not limited thereto. For example, the DC power supply 60 may be electrically connected to the edge ring 14 via the switching unit 61, the second RF filter 63, the first RF filter 62, and the lower electrode 12. In this case, the lower electrode 12 and the edge ring 14 are directly electrically coupled, and a self-bias voltage of the edge ring 14 is equal to a self-bias voltage of the lower electrode 12.

Here, when the lower electrode 12 and the edge ring 14 are directly electrically coupled, the thickness of the sheath on the edge ring 14 cannot be adjusted due to capacity below the edge ring 14 determined by a hard structure, and thus, an outer tilt state may occur even when a DC voltage is not applied. In this regard, in the present disclosure, since the tilt angle may be controlled by adjusting the DC voltage from the DC power supply 60, the impedance of the second RF filter 63, and the driving amount of the lifting device 80, the tilt angle can be adjusted to 0 (zero) degrees by changing the tilt angle to the inner side.

Other Embodiments

In the above embodiment, the adjustment of the impedance of the second RF filter 63, the adjustment of the DC voltage from the DC power supply 60, and the adjustment of the driving amount of the lifting device 80 are performed according to the consumption amount of the edge ring 14, but a timing of adjustment of the impedance, DC voltage, and driving amount is not limited thereto. For example, the driving amount, the impedance, and the DC voltage may be adjusted according to a processing time of the wafer W. Alternatively, the adjustment timing of the driving amount, impedance, and DC voltage may be determined by combining, for example, the processing time of the wafer W and predetermined parameters, such as high frequency power, for example.

Other Embodiments

In the above embodiment, the impedance of the second RF filter 63 is varied, but the impedance of the first RF filter 62 may be varied, and the impedance of both the RF filters 62 and 63 may be varied. In addition, although the two RF filters 62 and 63 are provided for the DC power supply 60 in the above embodiment, the number of RF filters is not limited thereto, and may be one, for example. In addition, in the above embodiment, although the impedance is varied by forming some elements of the second RF filter 63 as variable elements, the structure in which the impedance is varied is not limited thereto. For example, a device capable of changing the impedance of the RF filter may be connected to a variable or fixed impedance RF filter. That is, the RF filter having a variable impedance may be configured with an RF filter and a device connected to this RF filter and capable of changing the impedance of the RF filter.

<Configuration of Bypass Circuit and Tilt Control Knob>

As described above, in the initial state, after the initial tilt angle is adjusted by the bypass circuit 70, the tilt angle is controlled using the tilt control knob in etching. Next, a configuration for performing adjustment of the initial tilt angle and control of the tilt angle is described. As the structure, the following (1) to (8) may be mentioned.

(1) Bypass circuit 70 and second RF filter 63
(2) Bypass circuit 70 and DC power supply 60
(3) Bypass circuit 70 and lifting device 80
(4) Bypass circuit 70, second RF filter 63, and DC power supply 60
(5) Bypass circuit 70, second RF filter 63, and lifting device 80
(6) Bypass circuit 70, DC power supply 60, and lifting device 80
(7) Bypass circuit 70, second RF filter 63, DC power supply 60, and lifting device 80
(8) Bypass circuit 70 and DC pulsed power supply (1) Bypass Circuit 70 and Second RF Filter 63

Figure 18:
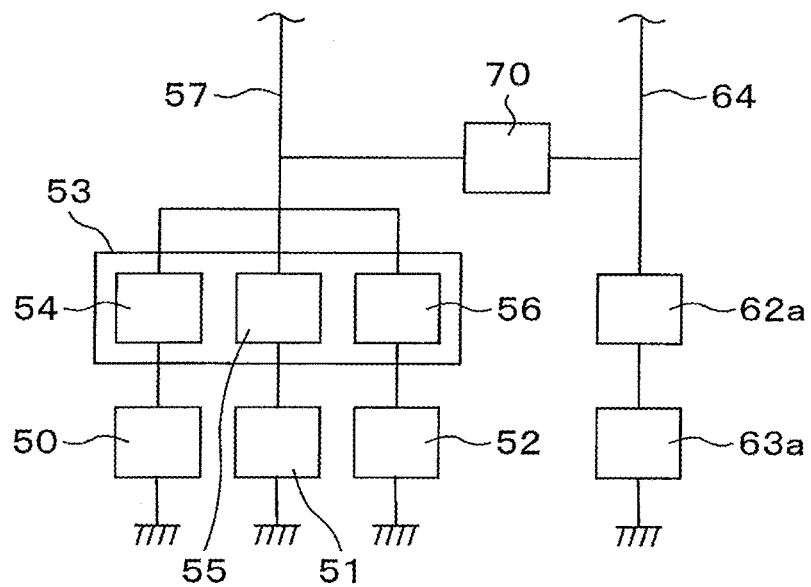
FIG. 18 is an explanatory view illustrating an example of a configuration of a bypass circuit and a tilt control knob.

In this configuration, after the initial tilt angle is adjusted by the bypass circuit 70 in the initial state, the impedance of the second RF filter 63 is adjusted in the etching to control the tilt angle. An example of this configuration may be the configuration illustrated in FIG. 2A. In addition, as illustrated in FIG. 18, an example of this configuration may be a configuration in which the DC power supply 60, the switching unit 61, the first RF filter 62, and the second RF filter 63 are omitted in the configuration illustrated in FIG. 2A. In this case, instead of the first RF filter 62 and the second RF filter 63, a first variable passive component 62a and a second variable passive component 63a are provided, respectively. The first variable passive component 62a and the second variable passive component 63a are arranged in this order from the edge ring 14 side. The second variable passive component 63a is connected to a ground potential. That is, the second variable passive component 63a is not connected to each of the first high frequency power supply 50, the second high frequency power supply 51, and the third high frequency power supply 52. In addition, as an example of this configuration, in the configuration illustrated in FIGS. 2 and 18, the lifting device 80 may be omitted.

In one example, at least one of the first variable passive component 62a and the second variable passive component 63a is configured to be variable in impedance. The first variable passive component 62a and the second variable passive component 63a may be either coils (inductors) or condensers (capacitors), for example. In addition, the same function can be achieved with any variable impedance element such as a diode, not limited to a coil or a condenser. The number and positions of the first variable passive component 62a and the second variable passive component 63a can also be appropriately designed by those skilled in the art. Furthermore, the elements themselves do not have to be variable. For example, a plurality of elements with fixed impedance values may be provided, and a switching circuit may be used to switch the combination of the elements with fixed impedance values to vary the impedance. A circuit configuration including the first variable passive component 62a and a circuit configuration including the second variable passive component 63a can be appropriately designed by those skilled in the art.

In this embodiment, the bypass circuit 70 is connected to the path 57 between the matching device 53 and the lower electrode 12 and the path 64 between the second variable passive component 63a and the edge ring 14, but the arrangement of the bypass circuit 70 is not limited to this. For example, although not shown, the bypass circuit 70 may be connected to the matching device 53 and the second variable passive component 63a.

(2) Bypass Circuit 70 and DC Power Supply 60

In this configuration, after the initial tilt angle is adjusted by the bypass circuit 70 in the initial state, the tilt angle is controlled by adjusting the DC voltage from the DC power supply 60 in etching. An example of this configuration may be the configuration of FIG. 2A. In addition, an example of this configuration may be a configuration in which the lifting device 80 is omitted in the configuration illustrated in FIG. 2A.

(3) Bypass Circuit 70 and Lifting Device 80

Figure 19:
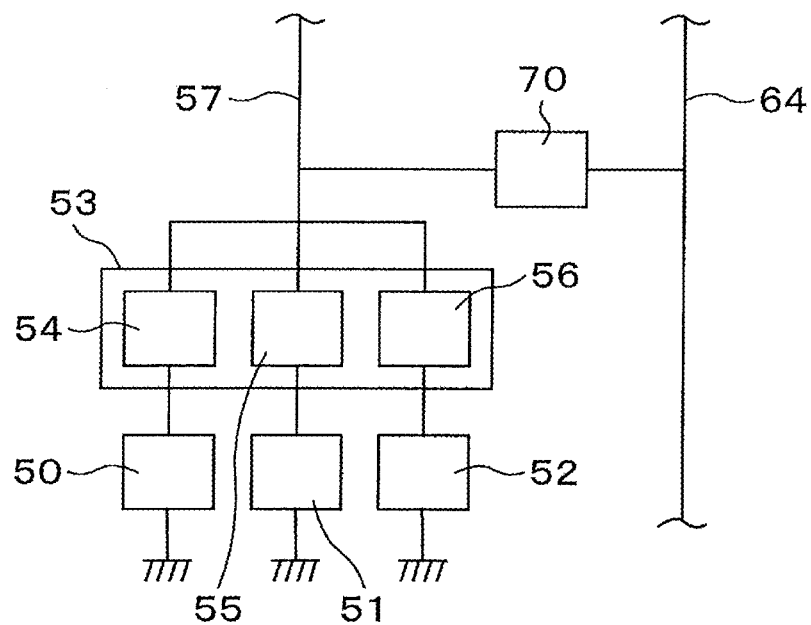
FIG. 19 is an explanatory view illustrating an example of a configuration of a bypass circuit and a tilt control knob.

In this configuration, after the initial tilt angle is adjusted by the bypass circuit 70 in the initial state, the driving amount of the lifting device 80 is adjusted in the etching to control the tilt angle. An example of this configuration may be the configuration illustrated in FIG. 2A. Moreover, as illustrated in FIG. 19, an example of this configuration may be a configuration in which the DC power supply 60, the switching unit 61, the first RF filter 62, and the second RF filter are omitted in the configuration illustrated in FIG. 2A. In this case, the bypass circuit 70 is connected to the path 64 which is connected to the edge ring 14.

(4) Bypass Circuit 70, Second RF Filter 63, and DC Power Supply 60

In this configuration, after adjusting the initial tilt angle by the bypass circuit 70 in the initial state, in the etching, the tilt angle is controlled by adjusting the impedance of the second RF filter 63 and the DC voltage from the DC power supply 60. An example of this configuration may be the configuration illustrated in FIG. 2A. In addition, an example of this configuration may be a configuration in which the lifting device 80 is omitted in the configuration illustrated in FIG. 2A.

(5) Bypass Circuit 70, Second RF Filter 63, and Lifting Device 80

In this configuration, after adjusting the initial tilt angle by the bypass circuit 70 in the initial state, the tilt angle is controlled by adjusting the impedance of the second RF filter 63 and the driving amount of the lifting device 80. An example of this configuration may be the configuration illustrated in FIG. 2A. Also, an example of this configuration may be the configuration illustrated in FIG. 18.

(6) Bypass Circuit 70, DC Power Supply 60, and Lifting Device 80

In this configuration, after adjusting the initial tilt angle by the bypass circuit 70 in the initial state, the tilt angle is controlled by adjusting the DC voltage from the DC power supply 60 and the driving amount of the lifting device 80 during etching. An example of this configuration may be the configuration illustrated in FIG. 2A.

(7) Bypass Circuit 70, Second RF Filter 63, DC Power Supply 60, and Lifting Device 80

In this configuration, after the initial tilt angle is adjusted by the bypass circuit 70 in the initial state, the tilt angle is controlled by adjusting the impedance of the second RF filter 63, the DC voltage from the DC power supply 60, and the driving amount of the lifting device 80. An example of this configuration may be the configuration illustrated in FIG. 2A.

(8) Bypass Circuit 70 and DC Pulsed Power Supply

In this configuration, after the initial tilt angle is adjusted by the bypass circuit 70 with respect to the initial state, the tilt angle is controlled by applying a pulsed negative voltage to the edge ring 14 in etching.

Figure 20:
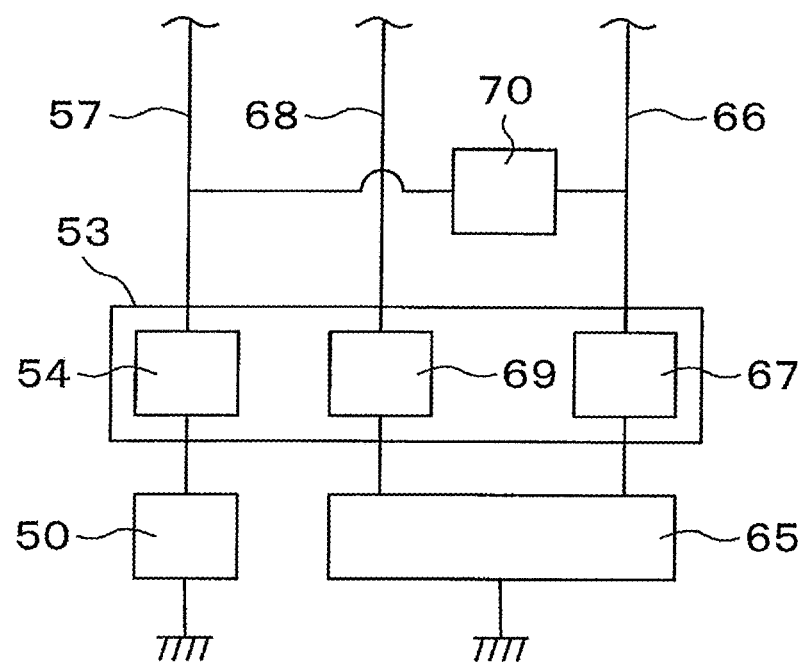
FIG. 20 is an explanatory view illustrating an example of a configuration of a bypass circuit and a tilt control knob.

As illustrated in FIG. 20, an example of this configuration may be a configuration in which the pulsed power supply 65 is disposed instead of the DC power supply 60 in the configuration illustrated in FIG. 2A. The pulsed power supply 65 may be configured to apply a pulse voltage by itself, or may be configured to include a DC power supply and a device (pulse generator) pulsing a voltage on a downstream side of the DC power supply. In this case, the bypass circuit 70 may be connected to the path 57 between the matching device 53 and the lower electrode 12 and a path 66 between the edge ring 14 and the pulsed power supply 65. Alternatively, although not shown, the bypass circuit 70 may be connected to the matching device 53 and a third RF filter 67 to be described later. Further, although not shown, when the edge ring 14 and the pulsed power supply 65 are not connected, the bypass circuit 70 may be directly connected to the edge ring 14. In this case, the lifting device 80 may be omitted.

The pulsed power supply 65 is a power supply that applies a pulse-shaped negative polarity voltage to the edge ring 14. The pulsed power supply 65 is coupled to the edge ring 14 in the path 66 between the edge ring 14 and the pulsed power supply 65. The path 66 is provided with the third RF filter 67 (corresponding to the second RF filter in the present disclosure) for protecting the pulsed power supply 65. The third RF filter 67 is provided in the matching device 53. Further, the pulsed power supply 65 is coupled to the lower electrode 12 in a path 68 between the lower electrode 12 and the pulsed power supply 65. The path 68 is provided with a fourth RF filter 69 (corresponding to the first RF filter in the present disclosure) for protecting the pulsed power supply 65. The fourth RF filter 69 is provided in the matching device 53. Alternatively, a matching circuit may be provided in place of the third RF filter 67 and the fourth RF filter 69, or the third RF filter 67, the fourth RF filter 69, and the matching circuit may be provided together.

In one example, the third RF filter 67 is configured to be variable in impedance. That is, the third RF filter 67 includes at least one variable passive component and has variable impedance. The variable passive component may be either coil (inductor) or condenser (capacitor), for example. In addition, the same function can be achieved with any variable impedance element such as a diode, not limited to a coil or a condenser. The number and position of the variable passive component can also be appropriately designed by those skilled in the art. Furthermore, the element itself does not have to be variable. For example, a plurality of elements with fixed impedance values may be provided, and a switching circuit may be used to switch the combination of the elements with fixed impedance values to vary the impedance. A circuit configuration including the third RF filter 67 and a circuit configuration including the fourth RF filter 69 can be appropriately designed by those skilled in the art.

In this case, the tilt angle is controlled by adjusting the pulse-shaped voltage from the pulsed power supply 65. For example, if the pulse-shaped voltage from the pulsed power supply 65 increases, the tilt correction angle may be increased. The tilt angle control by the pulse-shaped DC voltage from the pulsed power supply 65 is the same as the tilt angle control by the DC voltage from the DC power supply 60 described above.

In addition, when the pulsed power supply 65 includes a DC power supply and a pulse generator and functions as a power supply for plasma generation, the first matching circuit 54 may be omitted. In this case, the pulsed power supply 65 may function as a power supply for generating plasma alone.

Figure 21A:
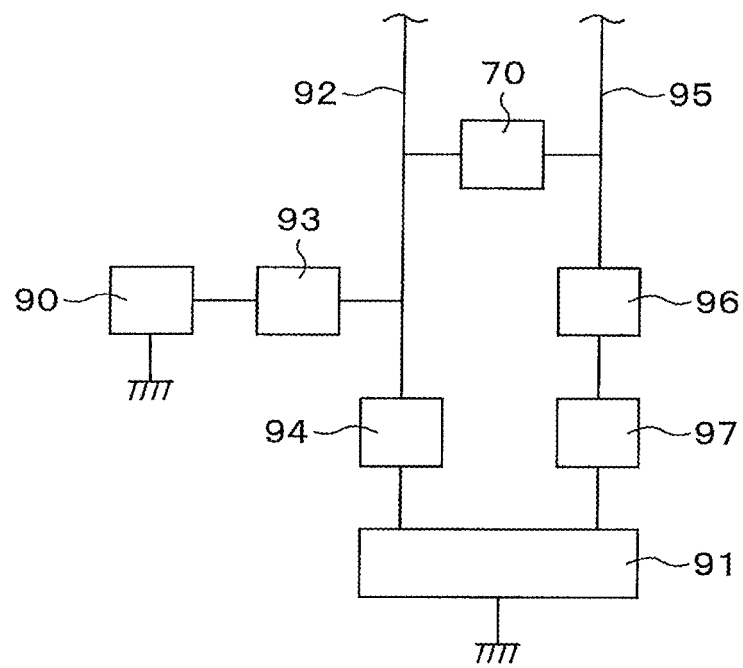
FIG. 21A is an explanatory view illustrating an example of a configuration of a bypass circuit and a tilt control knob.

Further, as shown in FIG. 21A, an example of this configuration may be a configuration in which a first pulsed power supply 90 and a second pulsed power supply 91 are arranged in the configuration shown in FIG. 2A. Each of the first pulsed power supply 90 and the second pulsed power supply 91 may be configured such that the power supply itself applies a pulsed voltage and to include a DC power supply and a device (pulse generator) downstream of the DC power supply to pulse voltage.

The first pulsed power supply 90 is provided in place of the first high frequency power supply 50, and applies a pulse-shaped negative first DC voltage (hereinafter referred to as "first pulse voltage") to the lower electrode 12 as source power for plasma generation. The first pulse voltage may be at a first frequency in the range of 27 MHz to 100 MHz, and in one example is 40 MHz. The first pulsed power supply 90 is coupled to the lower electrode 12 via a path 92. The path 92 is provided with a fifth RF filter 93 for protecting the first pulsed power supply 90. The first high frequency power supply 50 may not be electrically coupled to the lower electrode 12, and may be coupled to the shower head 20, which is the upper electrode.

The second pulsed power supply 91 is provided in place of the second high frequency power supply 51 and the third high frequency power supply 52, and applies a pulse-shaped negative second DC voltage (hereinafter referred to as "second pulse voltage") to the lower electrode 12 as bias power for attracting ions into the wafer W. The second pulse voltage may be at a second frequency in the range of 100 kHz to 15 MHz, and in one example is 400 kHz. The second pulsed power supply 91 is coupled to the lower electrode 12 via the path 92. The path 92 is provided with a sixth RF filter 94 (corresponding to the fourth RF filter in the present disclosure) for protecting the second pulsed power supply 91.

The second pulsed power supply 91 is provided in place of the DC power supply 60 and applies a negative DC voltage to the edge ring 14. The second pulsed power supply 91 is coupled to the edge ring 14 via a path 95. The path 95 is provided with a variable passive component 96 and a seventh RF filter 97 (corresponding to the fifth RF filter in the present disclosure) for protecting the second pulsed power supply 91. The variable passive component 96 and the seventh RF filter 97 are arranged in this order from the edge ring 14 side.

In one example, the variable passive component 96 is configured to be variable in impedance. The variable passive component 96 may be either coil (inductor) or condenser (capacitor), for example. In addition, the same function can be achieved with any variable impedance element such as a diode, not limited to a coil or a condenser. The number and position of the variable passive component 96 can also be appropriately designed by those skilled in the art. Furthermore, the element itself does not have to be variable. For example, a plurality of elements with fixed impedance values may be provided, and a switching circuit may be used to switch the combination of the elements with fixed impedance values to vary the impedance. A circuit configuration including the variable passive component 96 can be appropriately designed by those skilled in the art.

The bypass circuit 70 may be connected between the path 92 between the first pulsed power supply 90 and the second pulsed power supply 91 and the lower electrode 12 and the path 95 between the second pulsed power supply 91 and the edge ring 14.

In such a case, the pulse voltage from the second pulsed power supply 91 is adjusted to control the tilt angle. For example, if the pulse voltage from the second pulsed power supply 91 is increased, the tilt correction angle can be increased. The tilt angle control by the pulsed DC voltage from the second pulsed power supply 91 is the same as the tilt angle control by the DC voltage from the DC power supply 60 described above.

Figure 21B:
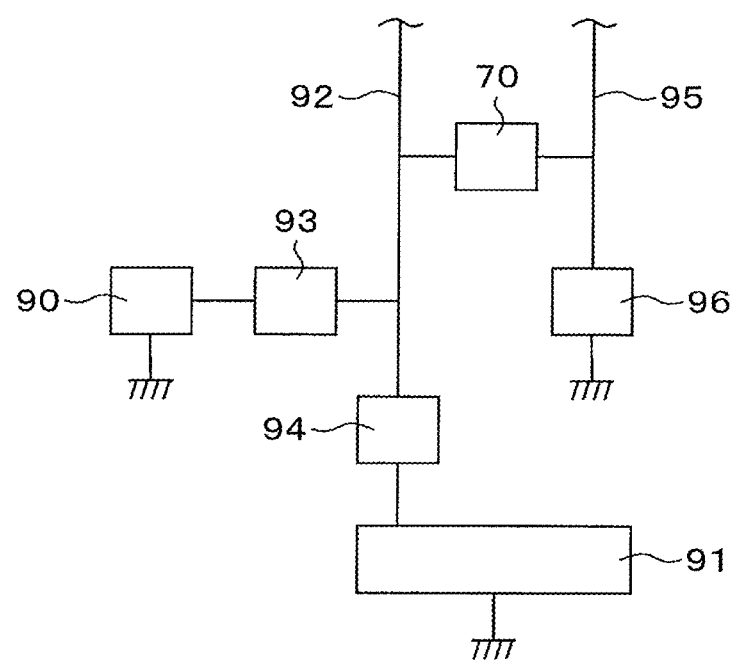
FIG. 21B is an explanatory view illustrating an example of a configuration of a bypass circuit and a tilt control knob.

The second pulsed power supply 91 may not be connected to the edge ring 14 as shown in FIG. 21B. In such case, the bypass circuit 70 is connected to the path 95 which is connected to the edge ring 14.

Other Embodiment

As described above, the frequency of the second high frequency power (bias RF power) LF1 supplied from the second high frequency power supply 51 is 400 kHz to 13.56 MHz, but 5 MHz or less is more preferable. In the case of performing etching, when high-aspect-ratio etching is performed on the wafer W, high ion energy is required to realize a vertical shape of the pattern after etching. Therefore, according to results of studies by the present inventors, it was found that, by setting the frequency of the second high frequency power LF1 to 5 MHz or less, the followability of ions to changes in the high frequency electric field was improved so that the controllability of ion energy was improved.

Meanwhile, when the frequency of the second high frequency power LF1 is set to a low frequency of 5 MHz or less, the effect of varying the impedance of the second RF filter 63 may be reduced. That is, the controllability of the tilt angle by adjustment of the impedance of the second RF filter 63 may be degraded. For example, in FIGS. 2A and 2B, when the electrical connection between the edge ring 14 and the second RF filter 63 is non-contact or capacitive coupling, the tilt angle cannot be properly controlled even if the impedance of the second RF filter 63 is adjusted. Therefore, in the present embodiment, the edge ring 14 and the second RF filter 63 are electrically directly connected to each other.

The edge ring 14 and the second RF filter 63 are electrically directly connected via a connecting portion. The edge ring 14 and the connecting portion are in contact, so that a direct current is conducted through the connecting portion. Hereinafter, an example of a structure of the connecting portion (hereinafter, may be referred to as "contact structure") is described.

Figure 22:
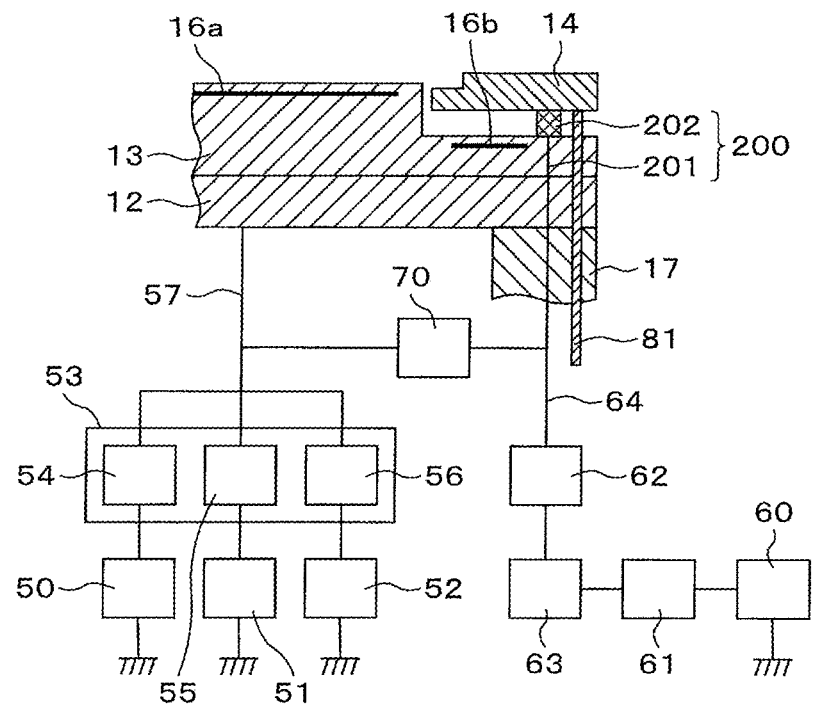
FIG. 22 is a longitudinal sectional view schematically illustrating a configuration around an edge ring according to another embodiment.

As illustrated in FIG. 22, the connecting portion 200 has a conductive structure 201 and a conductive member 202. The conductive structure 201 connects the edge ring 14 and the second RF filter 63 via the conductive member 202. Specifically, the conductive structure 201 has one end connected to the second RF filter 63 and the other end exposed from the upper surface of the lower electrode 12, and is in contact with the conductive member 202.

Figure 23A:
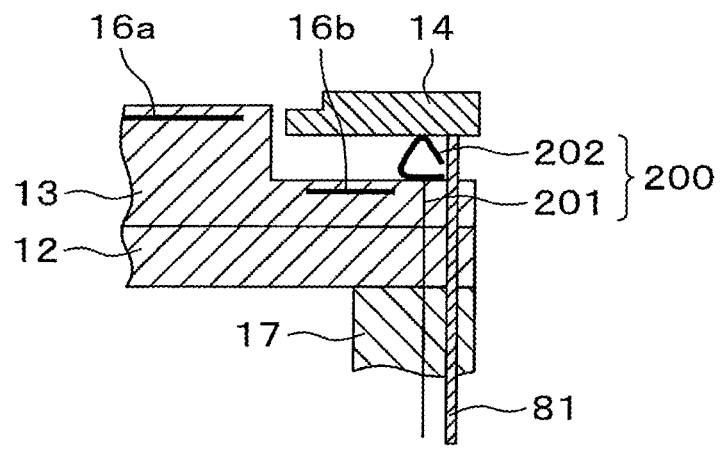
FIG. 23A is a longitudinal sectional view illustrating an example of a configuration of a connecting portion.
Figure 23B:
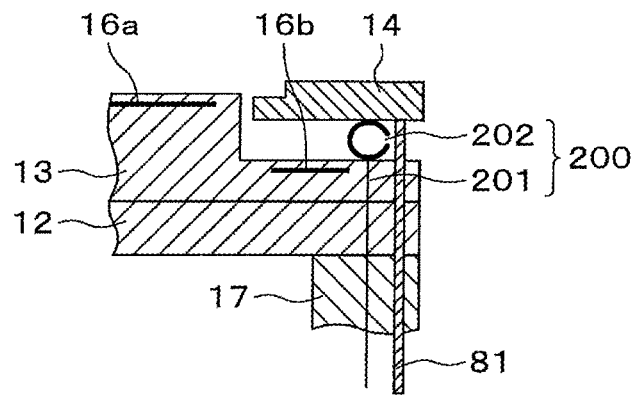
FIG. 23B is a longitudinal sectional view illustrating an example of a configuration of a connecting portion.
Figure 23C:
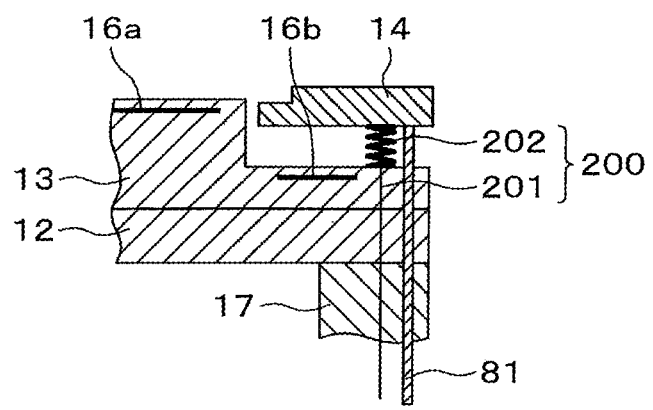
FIG. 23C is a longitudinal sectional view illustrating an example of a configuration of a connecting portion.

The conductive member 202 is provided, for example, in a space formed between the lower electrode 12 and the edge ring 14 on the side of the electrostatic chuck 13. The conductive member 202 contacts each of the conductive structure 201 and the lower surface of the edge ring 14. In addition, the conductive member 202 includes conductors, such as a metal, for example. Although the configuration of the conductive member 202 is not particularly limited, each example is illustrated in FIGS. 23A to 23F. FIGS. 23A to 23C are examples in which an elastic body is used as the conductive member 202.

As illustrated in FIG. 23A, for the conductive member 202, a plate spring biased in the vertical direction may be used. As illustrated in FIG. 23B, for the conductive member 202, a coil spring elongated in a horizontal direction, while being wound in a screw shape, may be used. As illustrated in FIG. 23C, for the conductive member 202, a spring elongated in a vertical direction, while being wound in a screw shape, may be used. Also, these conductive members 202 are elastic bodies, and elastic force acts in the vertical direction. By this elastic force, the conductive member 202 is brought into close contact with the conductive structure 201 and a lower surface of the edge ring 14 with a desired contact pressure, so that the conductive structure 201 and the edge ring 14 are electrically connected to each other.

Figure 23D:
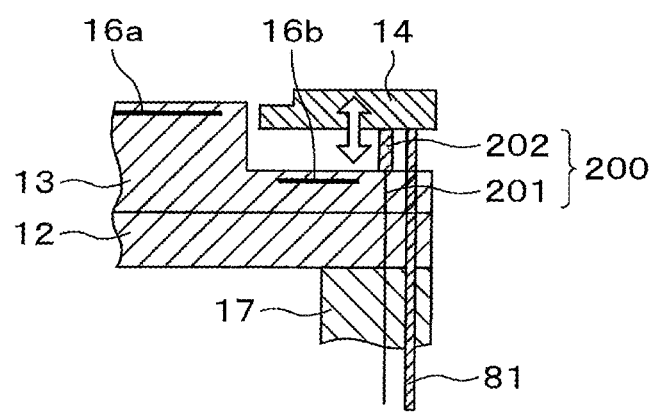
FIG. 23D is a longitudinal sectional view illustrating an example of a configuration of a connecting portion.

As illustrated in FIG. 23D, a pin that is lifted and lowered by a lifting mechanism (not shown) may be used for the conductive member 202. In this case, when the conductive member 202 is lifted, the conductive member 202 is brought into close contact with each of the conductive structure 201 and the lower surface of the edge ring 14. Then, by adjusting the pressure applied when the conductive member 202 is lifted and lowered, the conductive member 202 is brought into close contact with each of the conductive structure 201 and the lower surface of the edge ring 14 with a desired contact pressure.

Figure 23E:
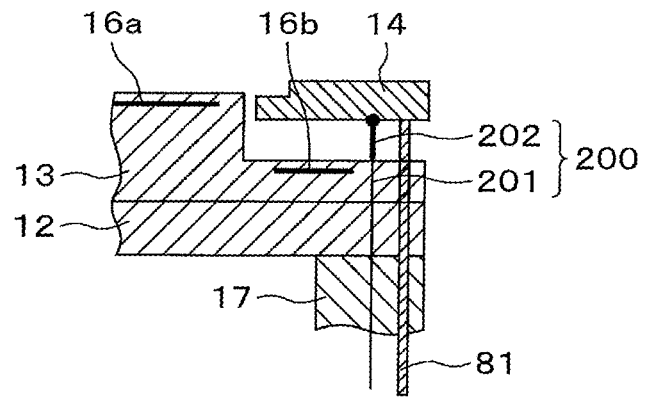
FIG. 23E is a longitudinal sectional view illustrating an example of a configuration of a connecting portion.

As illustrated in FIG. 23E, a wire connecting the conductive structure 201 and the edge ring 14 may be used for the conductive member 202. One end of the wire is joined to the conductive structure 201, and the other end is joined to the lower surface of the edge ring 14. The joining of the wire may be in ohmic contact with the conductive structure 201 or the lower surface of the edge ring 14, and, for example, the wire is welded or pressed. And, when a wire is used for the conductive member 202 as described above, the conductive member 202 is in contact with each of the conductive structure 201 and the lower surface of the edge ring 14, and the conductive structure 201 and the edge ring 14 are electrically connected to each other.

As described above, even when any of the conductive members 202 illustrated in FIGS. 23A to 23E are used, as illustrated in FIG. 22, the edge ring 14 and the second RF filter 63 may be electrically directly connected via the connecting portion 200. Therefore, the frequency of the second high frequency power LF1 may be set to a low frequency of 5 MHz or less, so that the controllability of the ion energy may be improved.

In addition, when the tilt angle is controlled by adjusting the driving amount of the lifting device 80, the driving amount to be adjusted may be suppressed to be small because the connecting portion 200 is provided. As a result, it is possible to suppress the occurrence of discharge between the wafer W and the edge ring 14. In addition, as described above, by adjusting the driving amount of the lifting device 80 and the impedance of the second RF filter 63, the adjustment range of the tilt angle may be widened and the tilt angle may be controlled to a desired value.

In addition, in the above embodiment, as the conductive member 202, the leaf spring illustrated in FIG. 23A, the coil spring illustrated in FIG. 23B, the spring illustrated in FIG. 23C, the pin illustrated in FIG. 23D, and the wire illustrated in FIG. 23E are illustrated, but these may be used in combination.

Figure 23F:
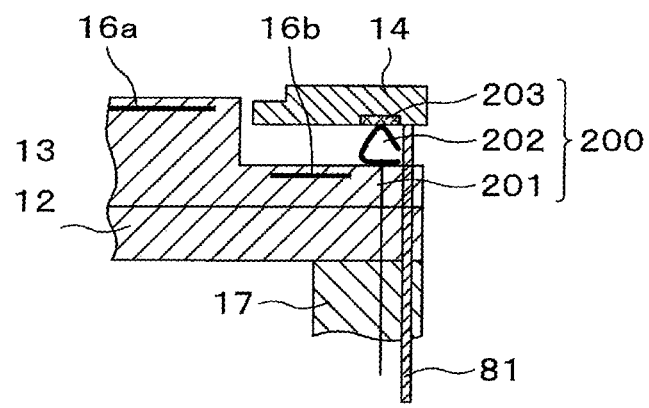
FIG. 23F is a longitudinal sectional view illustrating an example of a configuration of a connecting portion.

In addition, in the connecting portion 200 of the above embodiment, as illustrated in FIG. 23F, a conductor film 203 may be provided between the conductive member 202 of the connecting portion 200 and the edge ring 14. For the conductor film 203, for example, a metal film is used. The conductor film 203 is provided in at least at a portion in contact with the conductive member 202 on the lower surface of the edge ring 14. The conductor film 203 may be provided on the entire lower surface of the edge ring 14, or a plurality of conductor films 203 may be provided in a substantially annular shape as a whole. In either case, the resistance due to the contact of the conductive member 202 may be suppressed by the conductor film 203, so that the edge ring 14 and the second RF filter 63 may be connected appropriately.

It is preferable that the connecting portion 200 of the above embodiment has a configuration in which the conductive member 202 is protected from plasma, when the edge ring 14 is lifted by the lifting device 80. FIG. 24A to 24G each illustrate an example of the plasma countermeasure of the conductive member 202.

Figure 24A:
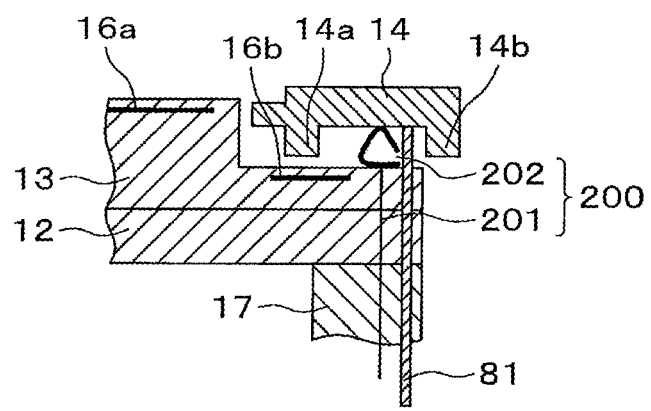
FIG. 24A is a longitudinal sectional view illustrating an example of a configuration of a connecting portion.

As illustrated in FIG. 24A, on the lower surface of the edge ring 14, protrusions 14a and 14b protruding downward from the lower surface may be provided. In the illustrated example, the protrusion 14a is provided on the radially inner side of the conductive member 202, and the protrusion 14b is provided on the radially outer side of the conductive member 202. That is, the conductive member 202 is provided in a concave portion formed by the protrusions 14a and 14b. In this case, the protrusions 14a and 14b may suppress the plasma from rounding to the conductive member 202, so that the conductive member 202 may be protected.

In addition, in the example of FIG. 24A, although the protrusions 14a and 14b are provided on the lower surface of the edge ring 14, the shape which suppresses the rounding of plasma is not limited thereto and may be determined according to the etching apparatus 1. In addition, the shape of the edge ring 14 may be determined so that the edge ring 14 may be lifted and lowered appropriately by the lifting device 80.

Figure 24B:
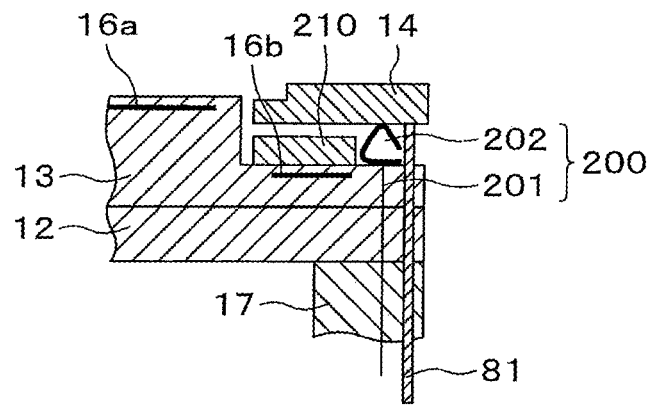
FIG. 24B is a longitudinal sectional view illustrating an example of a configuration of a connecting portion.

As illustrated in FIG. 24B, an insulating member 210 may be provided inside the conductive member 202 on the upper surface of the lower electrode 12. The insulating member 210 is provided separately from the lower electrode 12 and has, for example, an annular shape. In this case, the insulating member 210 may suppress the plasma from rounding to the conductive member 202, thereby protecting the conductive member 202.

Figure 24C:
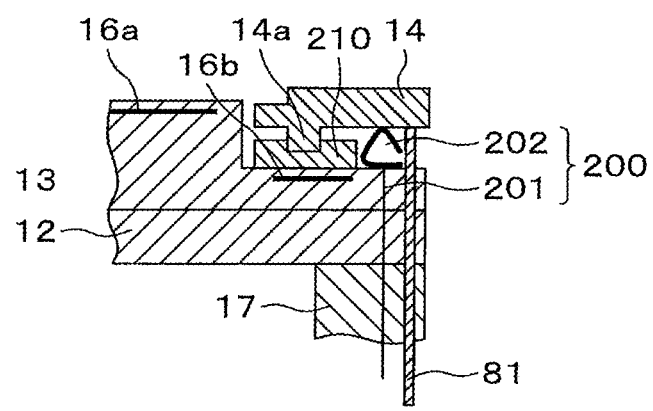
FIG. 24C is a longitudinal sectional view illustrating an example of a configuration of a connecting portion.

As illustrated in FIG. 24C, the protrusion 14a of the edge ring 14 illustrated in FIG. 24A and the insulating member 210 illustrated in FIG. 24B may be provided on both sides. In this case, by the protrusion 14a and the insulating member 210, the plasma may be further suppressed from rounding, thereby protecting the conductive member 202.

Figure 24D:
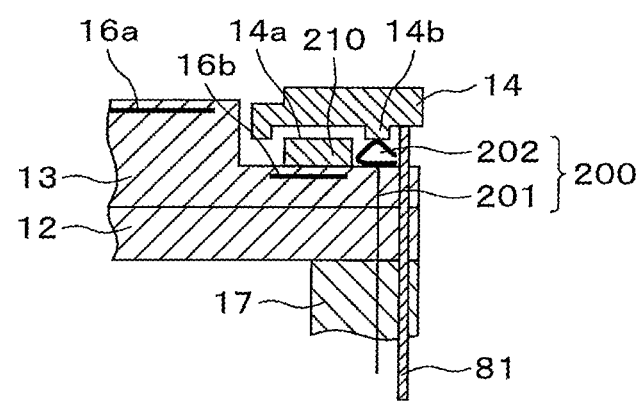
FIG. 24D is a longitudinal sectional view illustrating an example of a configuration of a connecting portion.

As illustrated in FIG. 24D, the protrusions 14a and 14b of the edge ring 14 illustrated in FIG. 24A and the insulating member 210 illustrated in FIG. 24B may be provided on both sides. The conductive member 202 is in contact with the protrusion 14b. In addition, the insulating member 210 is provided between the protrusions 14a and 14b. In this case, a labyrinth structure is formed by the protrusions 14a and 14b and the insulating member 210, and the rounding of plasma may be further suppressed, thereby protecting the conductive member 202.

Figure 24E:
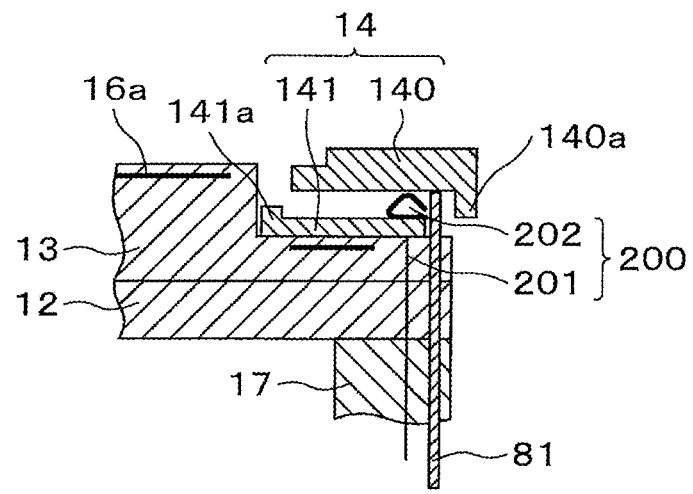
FIG. 24E is a longitudinal sectional view illustrating an example of a configuration of a connecting portion.

As illustrated in FIG. 24E, the edge ring 14 may be divided into an upper edge ring 140 and a lower edge ring 141. The upper edge ring 140 is configured to be liftable by the lifting device 80. The lower edge ring 141 is not lifted. The conductive member 202 is provided in contact with the lower surface of the upper edge ring 140 and the upper surface of the lower edge ring 141. The conductive structure 201 is connected to the lower edge ring 141. In this case, the upper edge ring 140 and the second RF filter 63 are electrically directly connected via the conductive member 202, the lower edge ring 141, and the conductive structure 201.

A protrusion 140a protruding downward from the lower surface is provided on the outermost periphery of the lower surface of the upper edge ring 140. A protrusion 141a protruding upward from the upper surface is provided on the innermost periphery of the upper surface of the lower edge ring 141. In this case, the protrusions 140a and 141a may suppress the plasma from rounding to the conductive member 202, thereby protecting the conductive member 202.

Figure 24F:
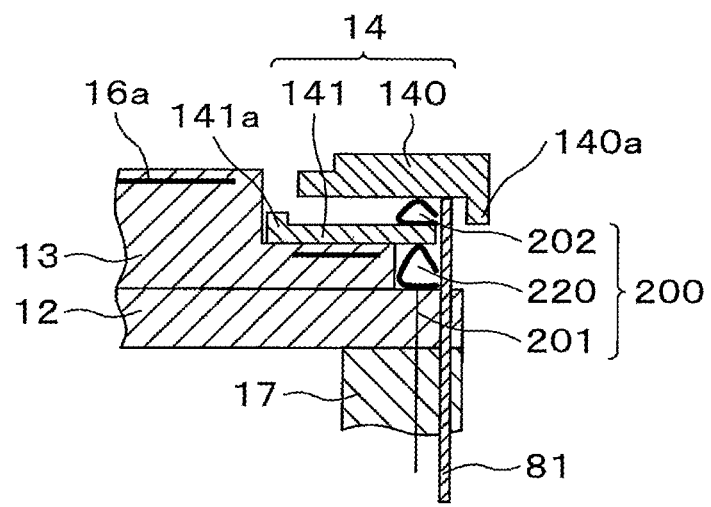
FIG. 24F is a longitudinal sectional view illustrating an example of a configuration of a connecting portion.

FIG. 24F is a modification of FIG. 24E. In the example illustrated in FIG. 24E, the conductive structure 201 is connected to the lower edge ring 141, but in the example illustrated in FIG. 24F, one end of the conductive structure 201 is exposed from the upper surface of the lower electrode 12 and is in contact with the conductive member 220. The conductive member 220 is provided in a space formed between the lower surface of the lower edge ring 141 and the upper surface of the lower electrode 12 radially outside the electrostatic chuck 13. That is, the conductive member 220 contacts the lower surface of the lower edge ring 141 and the conductive structure 201. In this case, the upper edge ring 140 and the second RF filter 63 are electrically directly connected via the conductive member 202, the lower edge ring 141, the conductive member 220, and the conductive structure 201. Also, in this example, the protrusions 140a and 141a may prevent the plasma from rounding to the conductive member 202, thereby protecting the conductive member 202.

Figure 24G:
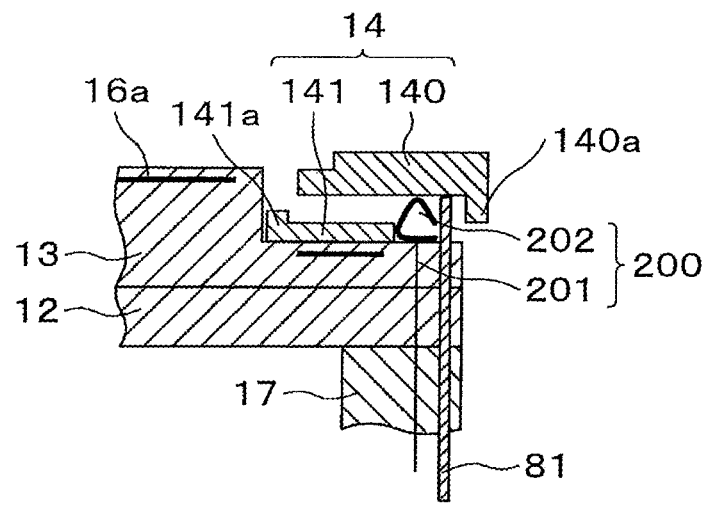
FIG. 24G is a longitudinal sectional view illustrating an example of a configuration of a connecting portion.

FIG. 24G is a modification of FIG. 24E. In the example illustrated in FIG. 24E, the conductive member 202 is provided on the upper surface of the lower edge ring 141, but in the example illustrated in FIG. 24G, the conductive member 202 is provided on the upper surface of the lower electrode 12. The conductive member 202 contacts the lower surface of the upper edge ring 140 and the conductive structure 201. One end of the conductive structure 201 is exposed from the upper surface of the electrostatic chuck 13 and contacts the conductive member 202. In this case, the upper edge ring 140 and the second RF filter 63 are electrically directly connected via the conductive member 202 and the conductive structure 201. Also in this example, the protrusions 140a and 141a prevent the plasma from rounding to the conductive member 202, and thus, the conductive member 202 may be protected.

Moreover, in the above embodiment, a combination of the configurations illustrated in FIGS. 24A to 24G may also be used. Moreover, in the connecting portion 200, plasma-resistant coating may be performed on a portion other than a portion in contact with the edge ring 14 of the surface of the conductive member 202. In this case, the conductive member 202 may be protected from plasma.

Figure 25A:
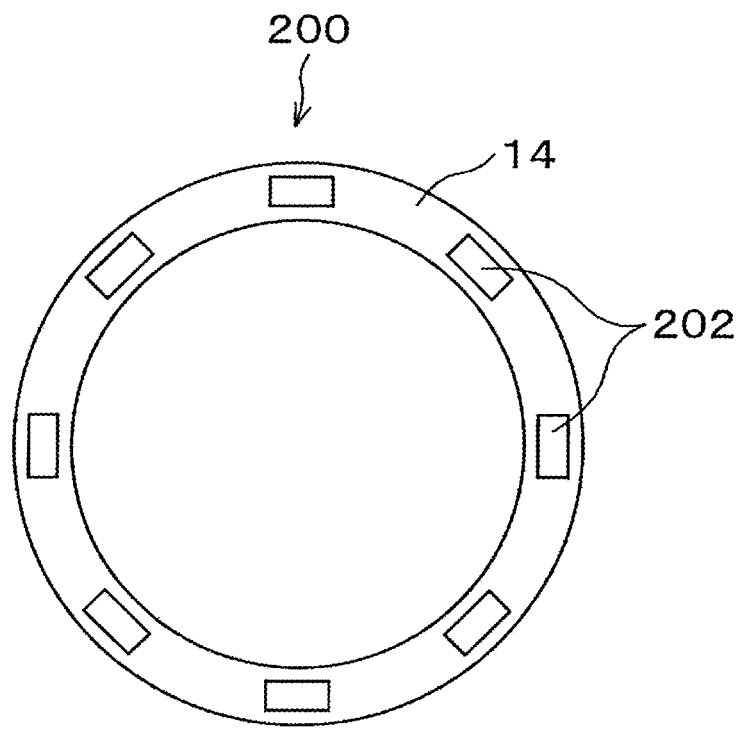
FIG. 25A is a plan view illustrating an example of a configuration of a connecting portion.
Figure 25B:
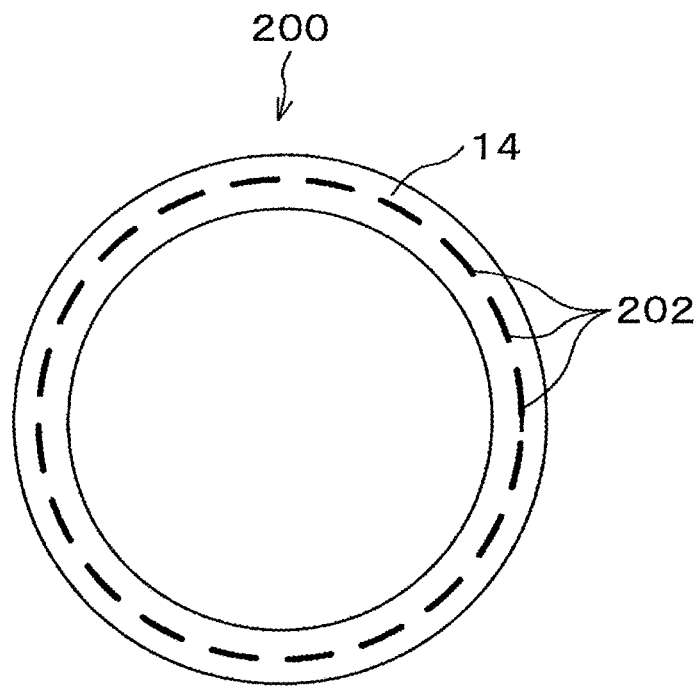
FIG. 25B is a plan view illustrating an example of a configuration of a connecting portion.
Figure 25C:
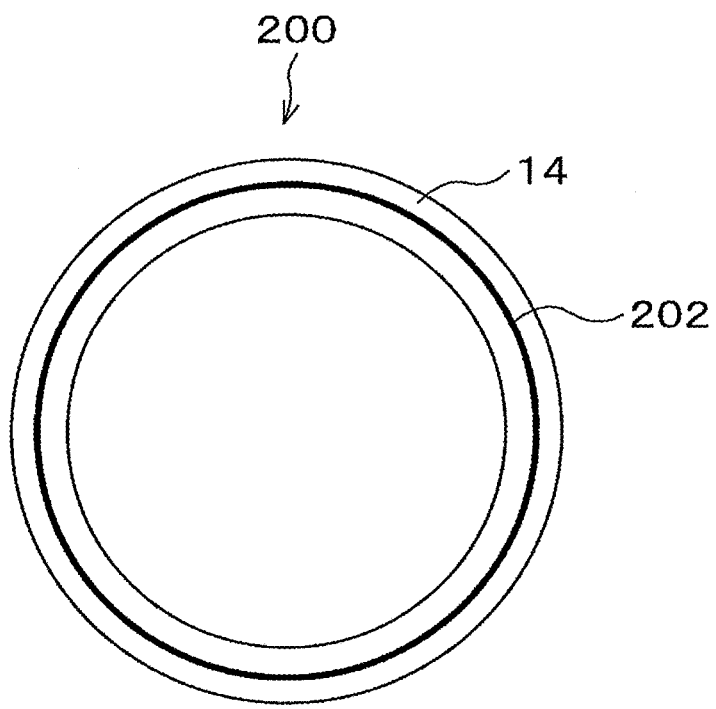
FIG. 25C is a plan view illustrating an example of a configuration of a connecting portion.

Next, a planar arrangement of the conductive member 202 is described. FIGS. 25A to 25C each illustrate an example of a planar arrangement of the conductive member 202. As illustrated in FIGS. 25A and 25B, the connecting portion 200 may include a plurality of conductive members 202, and the plurality of conductive members 202 may be provided concentrically with the edge ring 14 at equal intervals. In the example of FIG. 25A, the conductive member 202 is provided in eight locations, and in FIG. 25B, the conductive member 202 is provided in 24 locations. Moreover, as illustrated in FIG. 25C, the conductive member 202 may be provided on concentric circles with the edge ring 14 in an annular shape.

From the viewpoint of uniformly performing etching and uniformizing the shape of the sheath (from the viewpoint of process uniformity), as illustrated in FIG. 25C, it is preferable to form the conductive member 202 in an annular shape with respect to the edge ring 14 and to make the conductive member 202 contact the ring 14 uniformly on the circumference. Similarly, from the viewpoint of process uniformity, as illustrated in FIGS. 25A and 25B, even in the case of providing a plurality of conductive members 202, it is preferable to arrange the plurality of conductive members 202 at equal intervals in a circumferential direction and provide a contact point with respect to the edge ring 14 in point symmetry. In addition, it is better to increase the number of conductive members 202 as in the example of FIG. 25B as compared to the example of FIG. 25A and make them closer to the annular shape as illustrated in FIG. 25C. In addition, although the number of the conductive members 202 is not particularly limited, in order to ensure symmetry, three or more conductive members are preferable, and 3 to 36 conductive members may be provided, for example.

However, in terms of the device configuration, in order to avoid interference with other members, it may be difficult to make the conductive member 202 to have an annular shape or to increase the number of the conductive members 202 in some cases. Therefore, the planar arrangement of the conductive member 202 may be appropriately set in consideration of the conditions for process uniformity, the constraint conditions on the device configuration, and the like.

Figure 26A:
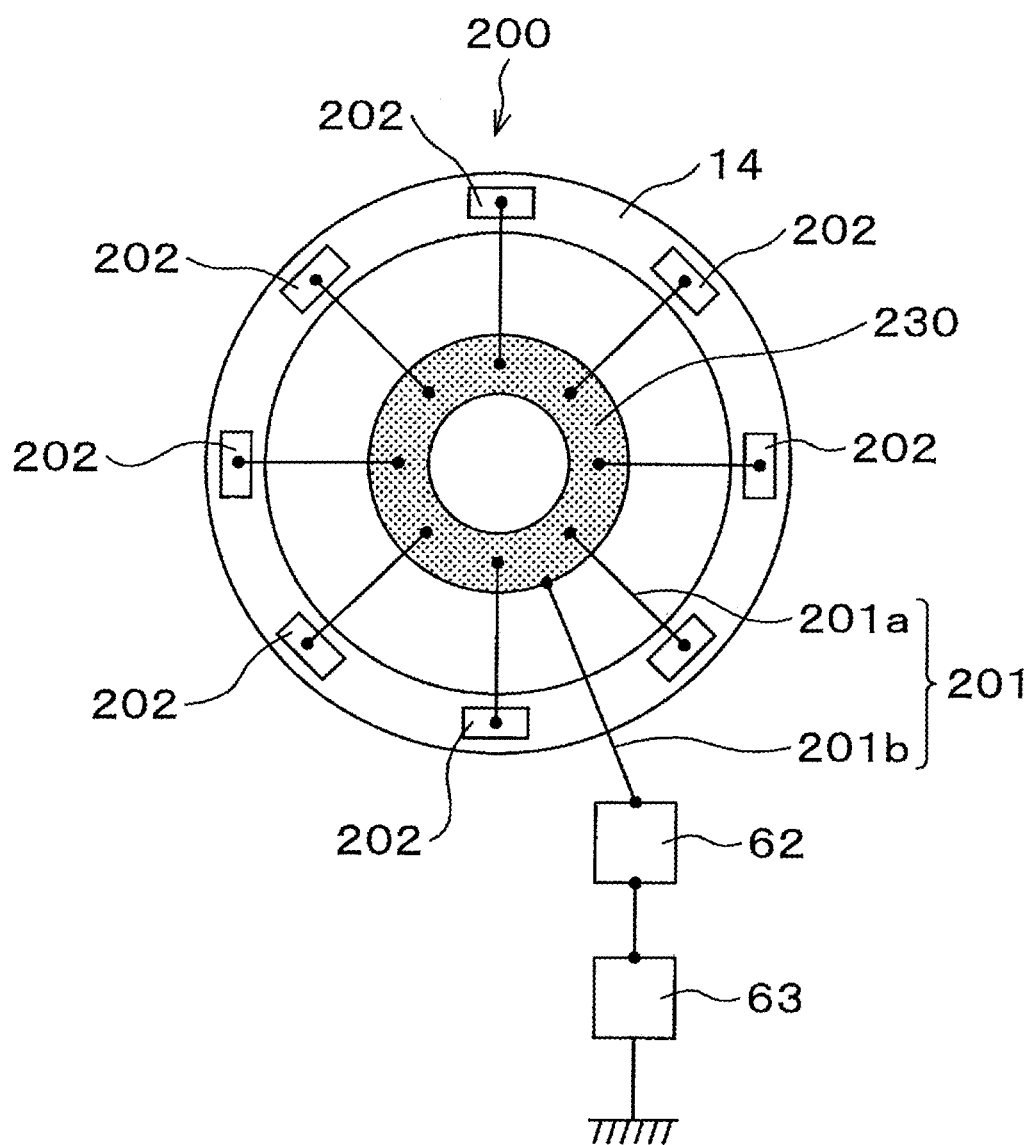
FIG. 26A is an explanatory view schematically illustrating an example of a configuration of a connecting portion and an RF filter.
Figure 26B:
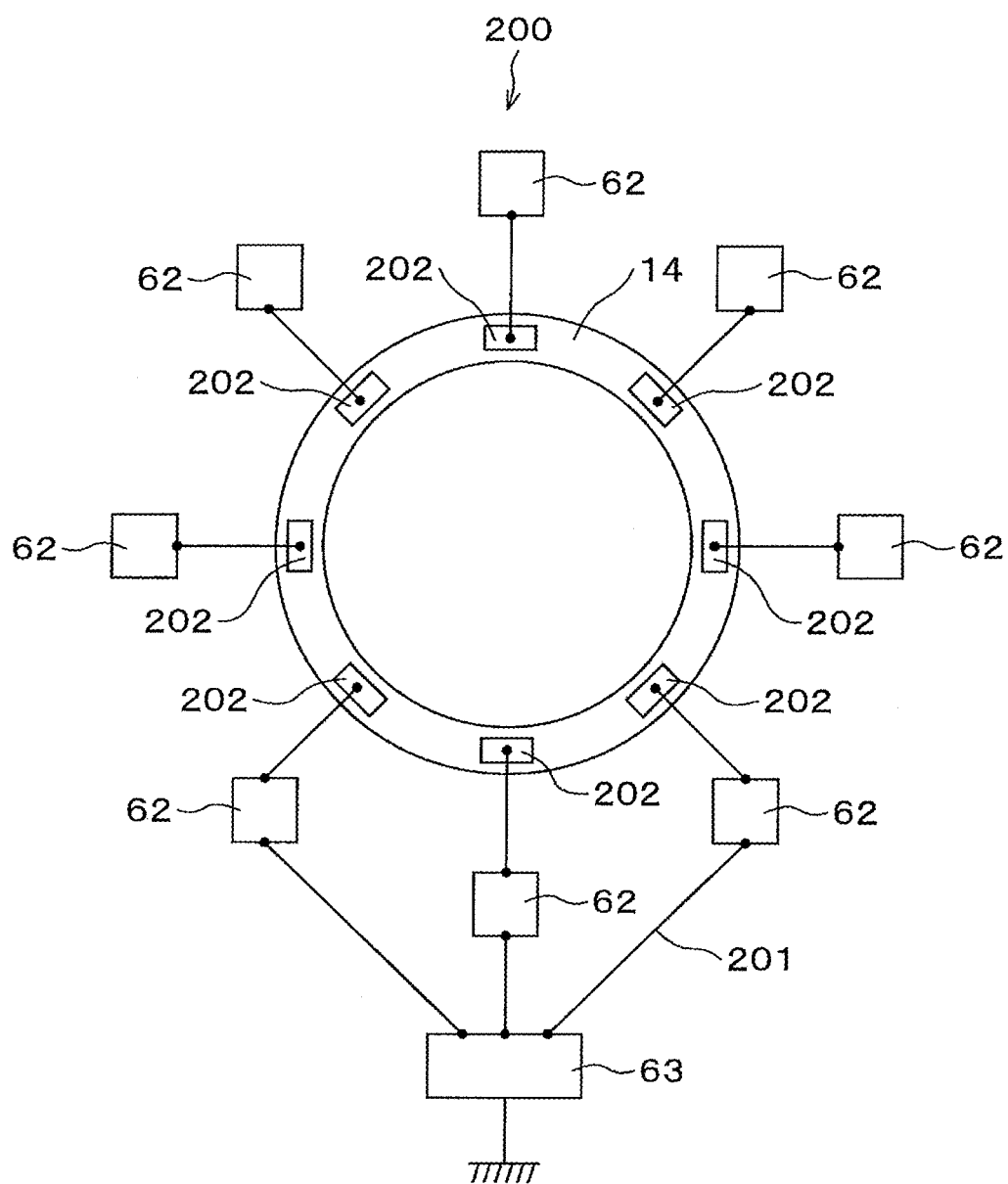
FIG. 26B is an explanatory view schematically illustrating an example of a configuration of a connecting portion and an RF filter.
Figure 26C:
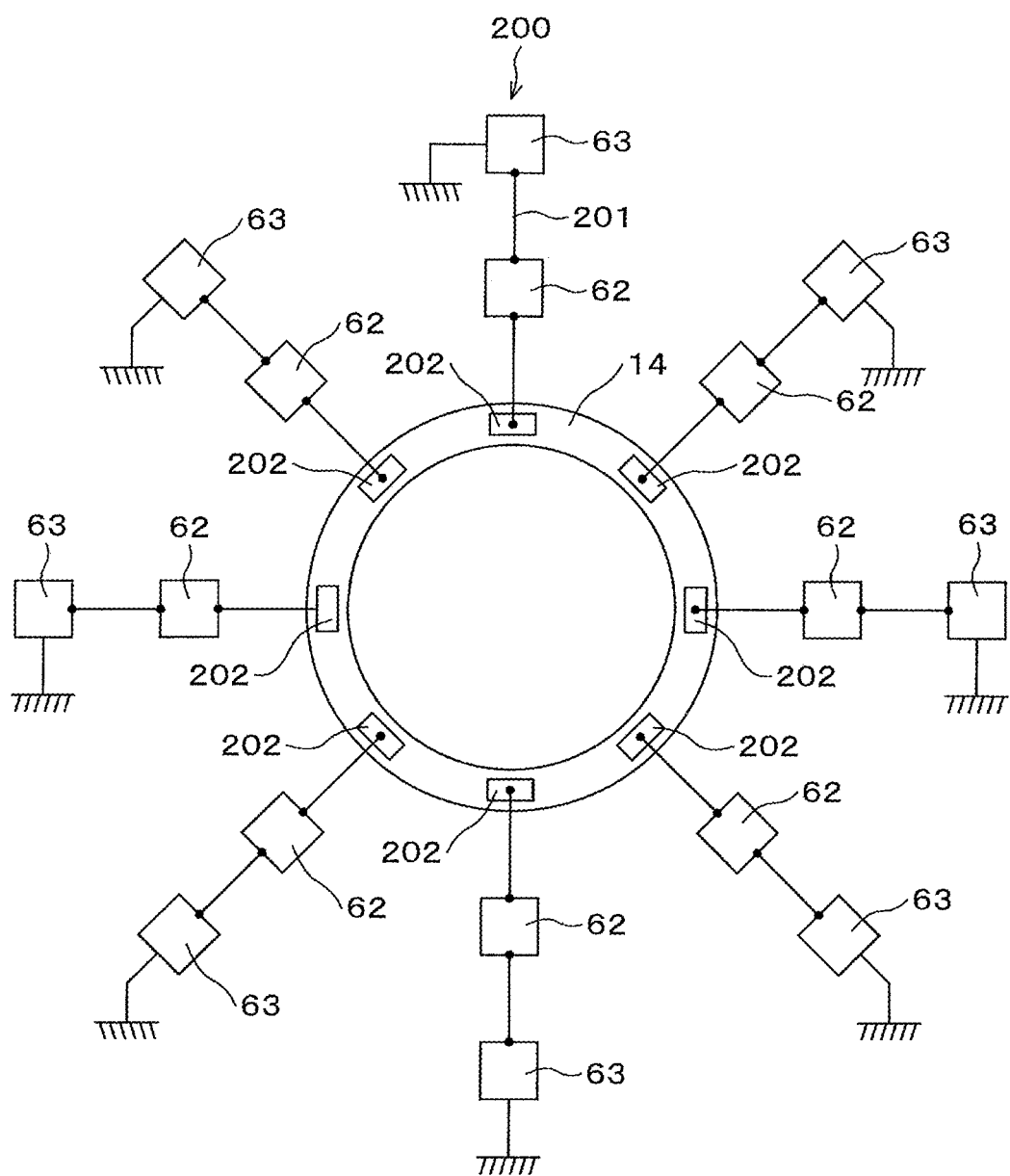
FIG. 26C is an explanatory view schematically illustrating an example of a configuration of a connecting portion and an RF filter.

Next, a relationship between the connecting portion 200 and the first RF filter 62 and the second RF filter 63 is described. FIGS. 26A to 26C each schematically illustrates an example of the configuration of the connecting portion 200, the first RF filter 62, and the second RF filter 63.

As illustrated in FIG. 26A, for example, when one first RF filter 62 and one second RF filter 63 are provided for each of the eight conductive members 202, the connecting portion 200 may have a relay member 230 additionally. In addition, although FIG. 26A illustrates a case in which the relay member 230 is provided in the connecting portion 200 illustrated in FIG. 25A, the relay member 230 may also be provided in the connecting portion 200 illustrated in either FIG. 25B or 25C. In addition, the relay member 230 may be provided in plurality.

The relay member 230 is annularly provided on a concentric circle with the edge ring 14 in the conductive structure 201 between the conductive member 202 and the second RF filter 63. The relay member 230 is connected to the conductive member 202 by the conductive structure 201a. That is, eight conductive structures 201a elongate radially from the relay member 230 in plan view, and are connected to the eight conductive members 202, respectively. Further, the relay member 230 is connected to the second RF filter 63 via the first RF filter 62 in the conductive structure 201b.

In this case, for example, even when the second RF filter 63 is not disposed at the center of the edge ring 14, the electrical characteristics (arbitrary voltage and current values) of the relay member 230 may be uniformly executed on the circumference, and it is possible to make the electrical characteristics for each of the eight conductive members 202 uniform. As a result, etching may be performed uniformly and the shape of the sheath may be uniform.

As illustrated in FIG. 26B, for example, with respect to the eight conductive members 202, a plurality of first RF filters 62, for example, eight RF filters 62, are provided, and one second RF filter 63 may be provided. Thus, with respect to the number of the conductive members 202, the number of the first RF filters 62 may be set appropriately. In addition, also in the example of FIG. 26B, the relay member 230 may be provided.

As illustrated in FIG. 26C, for example, a plurality of first RF filters 62, for example, eight first RF filters 62, may be provided for eight conductive members 202, and a plurality of second RF filters 63, for example, eight second RF filters 63, may be provided. As described above, with respect to the number of the conductive members 202, the number of the second RF filters 63 with variable impedance may be appropriately set. Also in the example of FIG. 26C, the relay member 230 may also be provided.

In addition, by providing a plurality of the second RF filters 63 having variable impedances, it is possible to individually and independently control the electrical characteristics of the plurality of conductive members 202. As a result, the electrical characteristics of each of the plurality of conductive members 202 may be controlled to be uniform, so that the uniformity of the process may be improved.

Next, as a contact structure for the edge ring 14, examples other than the examples illustrated in FIGS. 22 and 23A to 23F is described. FIGS. 27A to 27D and 28A to 28D each illustrate another example of the configuration of the connecting portion.

FIGS. 27A to 27D are examples in which a lifting pin 300 of the lifting device 80 are formed of an insulator and a connecting portion 310 is provided inside the lifting pin 300.

Figure 27A:
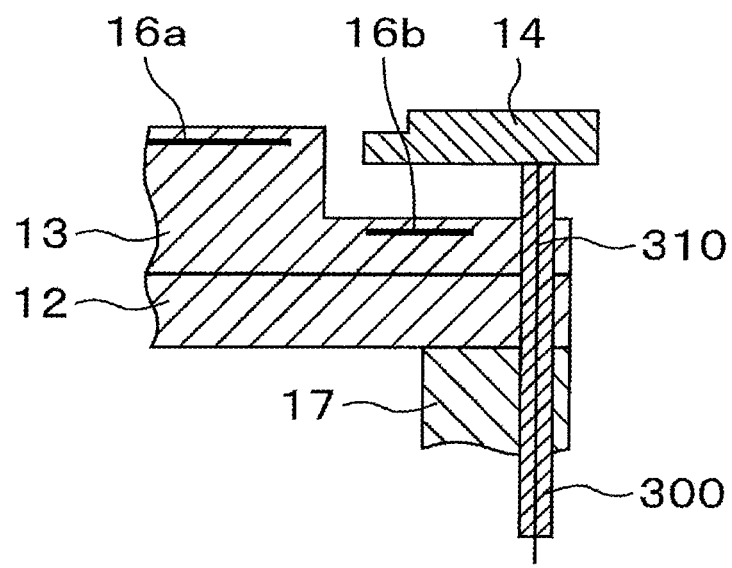
FIG. 27A is a longitudinal sectional view illustrating an example of a configuration of a connecting portion and a lifting device.

As illustrated in FIG. 27A, the lifting device 80 may include the lifting pin 300 in place of the lifting pin 81 in the above embodiment. The lifting pin 300 elongates in a vertical direction from the lower surface of the edge ring 14, and is provided through the electrostatic chuck 13, the lower electrode 12, the support member 17, and the bottom of the chamber 10. A portion between the lifting pin 300 and the chamber 10 is sealed in order to hermetically close the inside of the chamber 10. The lifting pin 300 is formed of an insulator. In addition, the lifting pin 300 is configured to be liftable by the driving source 82 provided outside the chamber 10.

The connecting portion 310 is provided inside the lifting pin 300. The connecting portion 310 directly connects the edge ring 14 and the lifting pin 300, and connects the edge ring 14 and the second RF filter 63. Specifically, the connecting portion 310 has one end connected to the second RF filter 63 and the other end exposed from the upper surface of the lifting pin 300, and is in contact with the lower surface of the edge ring 14.

Figure 27B:
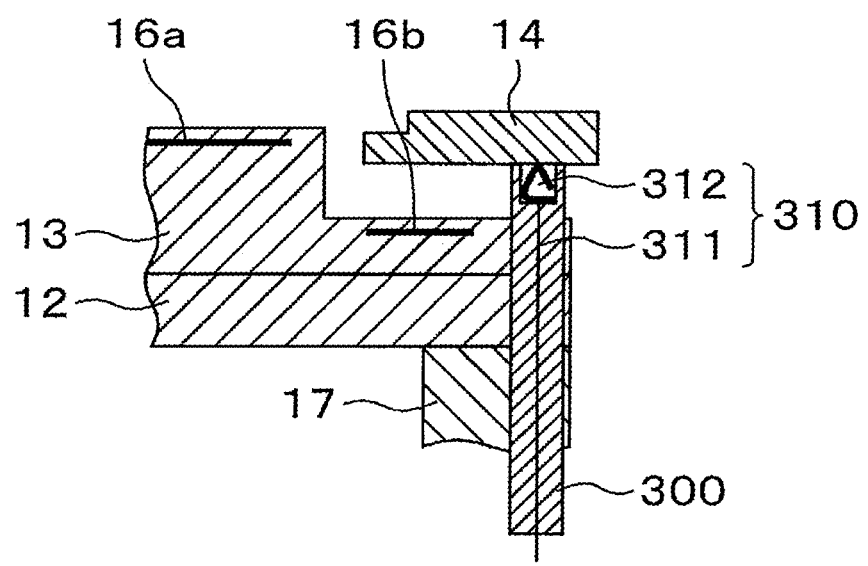
FIG. 27B is a longitudinal sectional view illustrating an example of a configuration of a connecting portion and a lifting device.
Figure 27C:
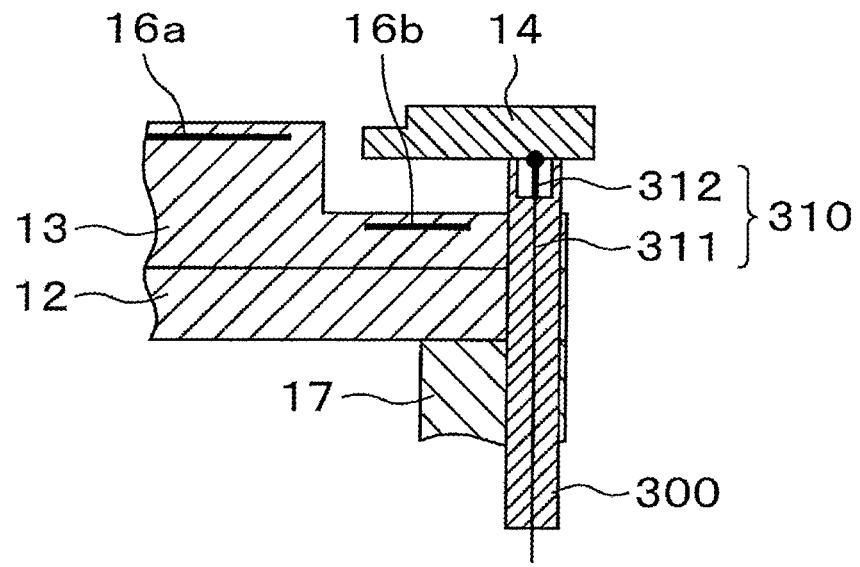
FIG. 27C is a longitudinal sectional view illustrating an example of a configuration of a connecting portion and a lifting device.

As illustrated in FIGS. 27B and 27C, the connecting portion 310 provided inside the lifting pin 300 may have a conductive structure 311 and a conductive member 312. The conductive structure 311 connects the edge ring 14 and the second RF filter 63 via the conductive member 312. Specifically, the conductive structure 311 has one end connected to the second RF filter 63 and the other end exposed in the upper space inside the lifting pin 300, and is in contact with the conductive member 312.

The conductive member 312 is provided in the upper space inside the lifting pin 300. A conductive member 312 contacts each of the conductive structure 311 and the lower surface of the edge ring 14. In addition, the conductive member 312 is formed of a conductor, such as a metal, for example. The configuration of the conductive member 312 is not particularly limited, but, for example, as illustrated in FIG. 27B, a leaf spring having elasticity applied in the vertical direction may be used, and as illustrated in FIG. 27C, a wire connecting the conductive structure and the edge ring 14 may be used. Alternatively, for the conductive member 312, a coil spring illustrated in FIG. 23B, a spring illustrated in FIG. 23C, a pin illustrated in FIG. 23D, or the like may be used. In this case, the upper edge ring 140 and the second RF filter 63 are electrically directly connected via the conductive member 312 and the conductive structure 311.

Figure 27D:
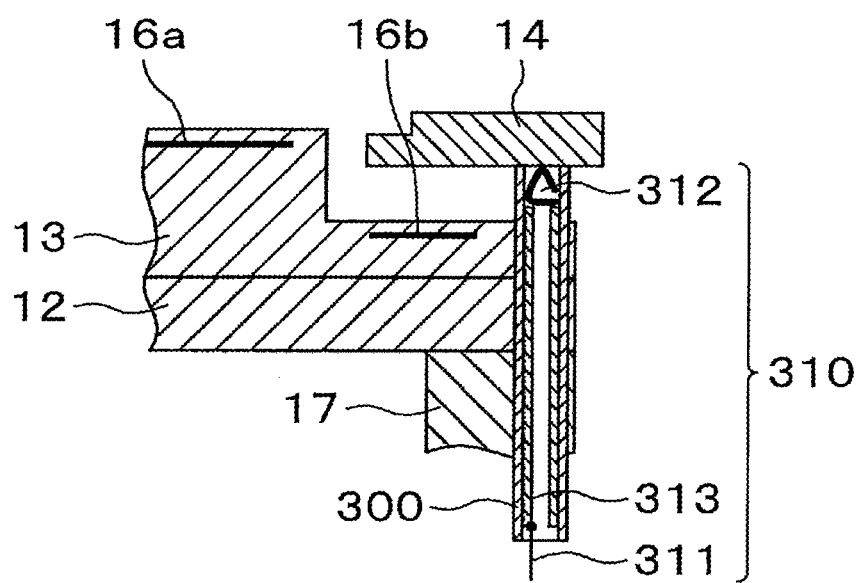
FIG. 27D is a longitudinal sectional view illustrating an example of a configuration of a connecting portion and a lifting device.

As illustrated in FIG. 27D, the lifting pin 300 has a hollow cylindrical shape with upper and lower surfaces open, and the connecting portion 310 provided inside the lifting pin 300 may have another conductive structure (second conductive structure) 313 in addition to the conductive structure (first conductive structure) 311 and the conductive member 312. The conductive structure 313 is provided on the inner surface of the lifting pin 300. The conductive structure 313 may be, for example, a metal film or a metal cylinder.

The conductive structure 311 is connected to a lower end of the conductive structure 313. The conductive member 312 is connected to an upper end of the conductive structure 313. In this case, the upper edge ring 140 and the second RF filter 63 are electrically directly connected via the conductive member 312, the conductive structure 313, and the conductive structure 311.

As mentioned above, no matter which connecting portion 310 illustrated in FIGS. 27A to 27D is used, the edge ring 14 and the second RF filter 63 may be electrically directly connected via the connecting portion 310. Therefore, the frequency of the second high frequency power LF1 may be set to a low frequency of 5 MHz or less, so that the controllability of the ion energy may be improved.

In addition, since the connecting portion 310 of the above embodiment is provided inside the lifting pin 300 formed of an insulator, it is not necessary to have a configuration protected from plasma.

FIGS. 28A to 28D illustrate examples in which a lifting pin 400 of a lifting device 80 is formed of a conductor and the lifting pin 400 itself constitute a connecting portion.

Figure 28A:
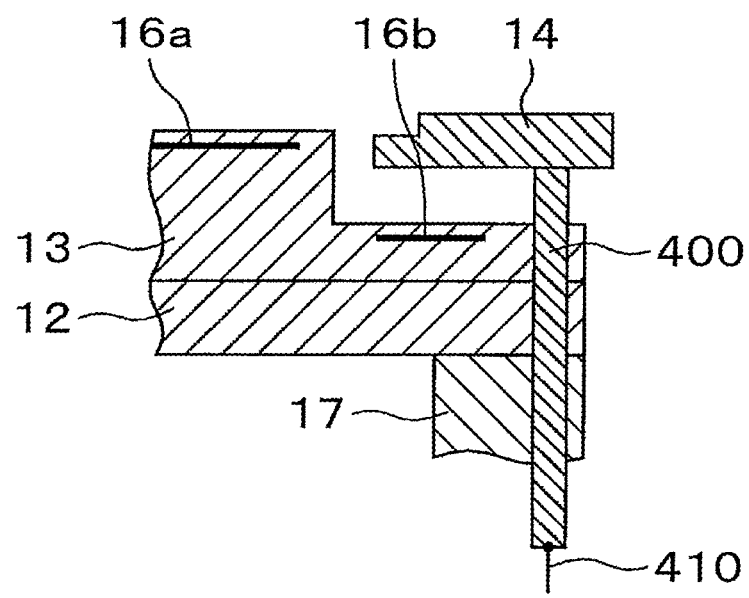
FIG. 28A is a longitudinal sectional view illustrating an example of a configuration of a connecting portion and a lifting device.

As illustrated in FIG. 28A, the lifting device 80 may include the lifting pin 400 in place of the lifting pins 81 and 300 of the above embodiment. The lifting pin 400 elongates in a vertical direction from the lower surface of the edge ring 14 and is provided through the electrostatic chuck 13, the lower electrode 12, the support member 17, and the bottom of the chamber 10. A portion between the lifting pin 400 and the chamber 10 is sealed in order to hermetically close the inside of the chamber 10. The lifting pin 400 is formed of a conductor. In addition, the lifting pin 400 is configured to be liftable by the driving source 82 provided outside the chamber 10.

A conductive structure 410 is connected to a lower end of the lifting pin 400. The conductive structure 410 is connected to a second RF filter 63. In this case, the upper edge ring 140 and the second RF filter 63 are electrically directly connected via the lifting pin 400 and the conductive structure 410.

Figure 28B:
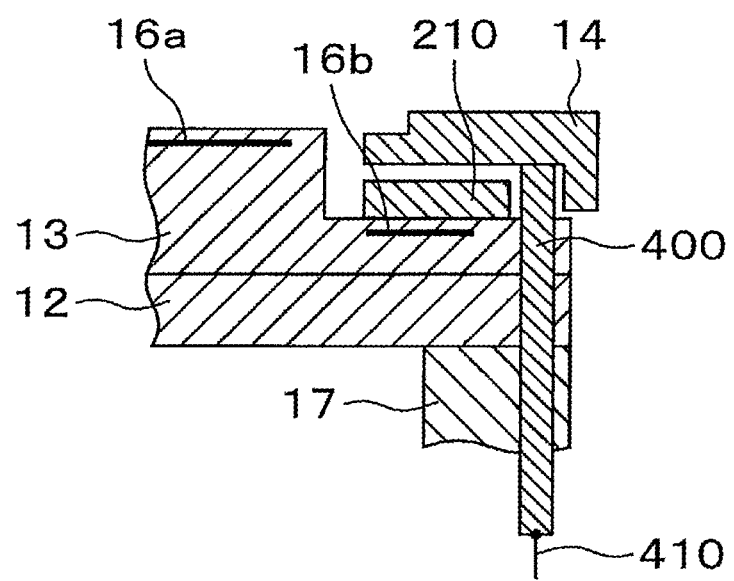
FIG. 28B is a longitudinal sectional view illustrating an example of a configuration of a connecting portion and a lifting device.
Figure 28C:
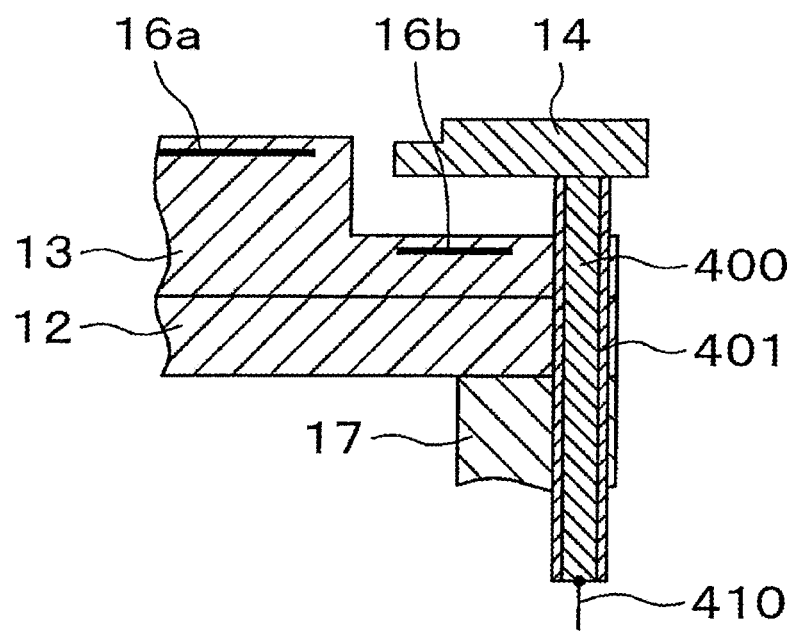
FIG. 28C is a longitudinal sectional view illustrating an example of a configuration of a connecting portion and a lifting device.

The lifting pin 400 preferably has a configuration that is protected from plasma when the edge ring 14 is lifted by the lifting device 80. FIGS. 28B to 28C each illustrate an example of the plasma countermeasure of the lifting pins 400.

As illustrated in FIG. 28B, the insulating member 210 illustrated in FIG. 24B may be provided inside the lifting pin 400 on the upper surface of the lower electrode 12. In this case, the insulating member 210 may suppress the plasma from rounding to the lifting pin 400, thereby protecting the lifting pin 400. In addition, the configuration for suppressing the rounding of plasma is not limited thereto, and any one of the configurations of FIGS. 24A and 24C to 24G may be applied.

As illustrated in FIG. 28C, an insulating member 401 having plasma resistance may be provided on the outer surface of the lifting pin 400. The insulating member 401 may be, for example, a film of an insulator or a cylinder formed of an insulator. In this case, the lifting pin 400 may be protected from plasma by the insulating member 401. Moreover, in the configuration of FIG. 28B, the insulating member 401 illustrated in FIG. 28C may be further provided.

As described above, even in the case illustrated in FIGS. 28A to 28C, the edge ring 14 and the second RF filter 63 may be electrically directly connected via the lifting pin 400. Therefore, the frequency of the second high frequency power LF1 may be set to a low frequency of 5 MHz or less, so that the controllability of the ion energy may be improved.

Figure 28D:
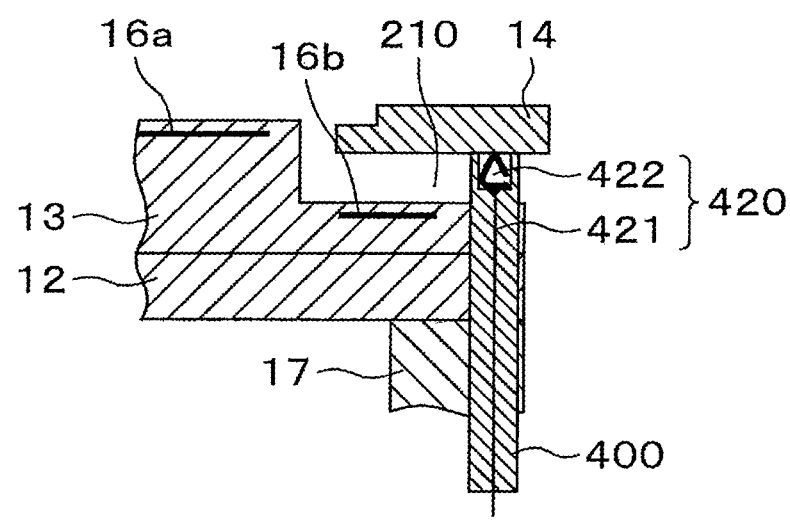
FIG. 28D is a longitudinal sectional view illustrating an example of a configuration of a connecting portion and a lifting device.

Also, in FIGS. 28A to 28C, the lifting pin 400 itself constitutes the connecting portion, but as illustrated in FIG. 28D, the connecting portion 420 may be additionally provided inside the lifting pin 400. The connecting portion 420 may have a conductive structure 421 and a conductive member 422. The conductive structure 421 connects the edge ring 14 and the second RF filter 63 via the conductive member 422. Specifically, one end of the conductive structure 421 is connected to the second RF filter 63, and the other end thereof is exposed in the upper space of the lifting pin 400 and contacts the conductive member 422. Also, the conductive structure 410 is included in the conductive structure 421.

The conductive member 422 is provided in the upper space inside the lifting pin 400. The conductive member 422 contacts each of the conductive structure 421 and the lower surface of the edge ring 14. In addition, the conductive member 422 is formed of a conductor, such as a metal, for example. Although the configuration of the conductive member 312 is not particularly limited, for example, a plate spring biased in a vertical direction illustrated in FIG. 23A may be used. Alternatively, the coil spring illustrated in FIG. 23B, the spring illustrated in FIG. 23C, the pin illustrated in FIG. 23D, the wire illustrated in FIG. 23E, or the like may be used. In this case, the upper edge ring 140 and the second RF filter 63 are electrically directly connected via the conductive member 312 and the conductive structure 311 in addition to the lifting pin 400. Moreover, since the resistance due to the contact of the lifting pin 400 and the conductive member 312 may be suppressed, the edge ring 14 and the second RF filter 63 may be connected more appropriately.

Other Embodiment

Although the etching apparatus 1 of the above embodiment is a capacitively coupled etching apparatus, the etching apparatus to which the present disclosure is applied is not limited thereto. For example, the etching apparatus may be an inductively coupled etching apparatus.

It should be considered that embodiment disclosed herein is illustrative in every point, and is not restrictive. The above embodiments may be omitted, replaced, or changed in various forms without departing from the appended claims and the gist thereof.

Embodiments of the present disclosure further include the following aspects.

(Additional Statement A1)

An etching apparatus performing etching on a substrate, the etching apparatus comprising:
  a chamber;
  a substrate support provided inside the chamber and including an electrode, an electrostatic chuck, and a conductive edge ring disposed to surround the substrate mounted on the electrostatic chuck;
  a high frequency power supply supplying high frequency power to the electrode;
  at least one matching circuit connected to the high frequency power supply;
  a radio frequency (RF) filter connected to the edge ring and changing impedance; and
  a bypass circuit connected to the matching circuit or a path between the matching circuit and the electrode and connected to the RF filter or a path between the RF filter and the edge ring.

(Additional Statement A2)

The etching apparatus of additional statement A1, further comprising:
  a DC power supply applying a negative polarity DC voltage to the edge ring via the RF filter,
  wherein the bypass circuit is connected to the matching circuit or a path between the matching circuit and the electrode and connected to the DC power supply or to a path between the DC power supply and the edge ring.

(Additional Statement A3)

An etching apparatus performing etching on a substrate, the etching apparatus comprising:
  a chamber;
  a substrate support provided inside the chamber and including an electrode, an electrostatic chuck, and a conductive edge ring disposed to surround the substrate mounted on the electrostatic chuck;
  a high frequency power supply supplying high frequency power to the electrode;
  at least one matching circuit connected to the high frequency power supply;
  a DC power supply applying a negative DC voltage to the edge ring; and
  a bypass circuit connected to the matching circuit or a path between the matching circuit and the electrode and connected to the DC power supply or a path between the DC power supply and the edge ring.

(Additional Statement A4)

The etching apparatus of any one of additional statements A1 to A3, further comprising:
  a lifting device lifting and lowering the edge ring.

(Additional Statement A5)

An etching apparatus performing etching on a substrate, the etching apparatus comprising:
  a chamber;
  a substrate support provided inside the chamber and including an electrode, an electrostatic chuck, and a conductive edge ring disposed to surround the substrate mounted on the electrostatic chuck;
  a high frequency power supply supplying high frequency power to the electrode;

at least one matching circuit connected to the high frequency power supply;
a lifting device lifting and lowering the edge ring; and
a bypass circuit connected to the matching circuit, a path between the matching circuit and the electrode, and the edge ring.

(Additional Statement A6)

The etching apparatus of any one of additional statements A1 to A5, wherein
the bypass circuit controls an amount of power supplied to the edge ring and adjusts an initial tilt angle in an edge region of the substrate mounted on the electrostatic chuck.

(Additional Statement A7)

The etching apparatus of any one of additional statements A1 to A6, wherein
high frequency powers of a plurality of frequencies are supplied from the high frequency power supply, and
a tilt angle in an edge region of the substrate mounted on the electrostatic chuck is controlled for high frequency powers of two or more frequencies, among the high frequency powers of the plurality of frequencies.

(Additional Statement A8)

The etching apparatus of additional statement A7, wherein
the bypass circuit is provided in plurality.

(Additional Statement A9)

A method for performing etching on a substrate using an etching apparatus, wherein the etching apparatus comprising:
a chamber;
a substrate support provided inside the chamber and including an electrode, an electrostatic chuck, and a conductive edge ring disposed to surround the substrate mounted on the electrostatic chuck;
a high frequency power supply supplying high frequency power to the electrode;
at least one matching circuit connected to the high frequency power supply;
a radio frequency (RF) filter connected to the edge ring and changing impedance; and
a bypass circuit connected to the matching circuit or a path between the matching circuit and the electrode and connected to the RF filter or a path between the RF filter and the edge ring,
wherein the method includes a process of adjusting an initial tilt angle before etching in an edge region of the substrate mounted on the electrostatic chuck by controlling an amount of power supplied to the edge ring by the bypass circuit.

(Additional Statement A10)

A method for performing etching on a substrate using an etching apparatus, wherein the etching apparatus comprising:
a chamber;
a substrate support provided inside the chamber and including an electrode, an electrostatic chuck, and a conductive edge ring disposed to surround the substrate mounted on the electrostatic chuck;
a high frequency power supply supplying high frequency power to the electrode;
at least one matching circuit connected to the high frequency power supply;
a DC power supply applying a negative polarity DC voltage to the edge ring; and
a bypass circuit connected to the matching circuit or a path between the matching circuit and the electrode and connected to the DC power supply or a path between the DC power supply and the edge ring,
wherein the method includes a process of adjusting an initial tilt angle before etching in an edge region of the substrate mounted on the electrostatic chuck by controlling an amount of power supplied to the edge ring by the bypass circuit.

(Additional Statement A11)

A method for performing etching on a substrate using an etching apparatus, wherein the etching apparatus comprising:
a chamber;
a substrate support provided inside the chamber and including an electrode, an electrostatic chuck, and a conductive edge ring disposed to surround the substrate mounted on the electrostatic chuck;
a high frequency power supply supplying high frequency power to the electrode;
at least one matching circuit connected to the high frequency power supply;
a lifting device lifting and lowering the edge ring; and
a bypass circuit connected to the matching circuit, a path between the matching circuit and the electrode, and the edge ring,
wherein the method includes a process of adjusting an initial tilt angle before etching in an edge region of the substrate mounted on the electrostatic chuck by controlling an amount of power supplied to the edge ring by the bypass circuit.

(Additional Statement B1)

A plasma processing apparatus comprising:
a chamber;
a substrate support disposed in the chamber and including a lower electrode, a substrate supporting surface for supporting a substrate, and an edge ring disposed to surround the substrate placed on the substrate supporting surface;
an upper electrode disposed above the lower electrode;
a power supply configured to supply two or more powers having different frequencies, the power supply including a source power supply configured to supply a source power for generating plasma from a gas in the chamber to the upper electrode or the lower electrode, and at least one bias power supply configured to supply one bias power or two or more bias powers having different frequencies to the lower electrode;
at least one variable passive component electrically connected to the edge ring; and
at least one bypass circuit that electrically connects the power supply and the edge ring and is configured to supply a part of at least one power selected from the group consisting of the source power and at least one bias power to the edge ring.

(Additional Statement B2)

The plasma processing apparatus of additional statement B1, wherein said at least one bypass circuit is configured to supply a part of said at least one power selected depending on a frequency to the edge ring.

(Additional Statement B3)

The plasma processing apparatus of additional statement B2, wherein said at least one bypass circuit is configured to include a combination of a bypass circuit independently provided for each frequency and a bypass circuit commonly provided for a plurality of frequencies.

(Additional Statement B4)

The plasma processing apparatus of any one of additional statements B1 to B3, wherein said at least one bypass circuit is configured to control a magnitude of said at least one power supplied to the edge ring.

(Additional Statement B5)

The plasma processing apparatus of any one of additional statements B1 to B4, wherein the source power supply is configured to supply a source RF power as the source power, and
said at least one bias power supply is configured to apply, as the bias power, at least one bias RF power having different frequencies or at least one negative pulse voltage having different frequencies.

(Additional Statement B6)

The plasma processing apparatus of additional statement B5, further comprising:
a matching device including a first matching circuit and at least one second matching circuit,
wherein said at least one bias power supply is configured to supply, as the bias power, at least one bias RF power having different frequencies,
the source power supply is connected to the upper electrode or the lower electrode through the first matching circuit, and
said at least one bias power supply is connected to the lower electrode through said at least one second matching circuit.

(Additional Statement B7)

The plasma processing apparatus of additional statement B6, wherein the bypass circuit is disposed on a first path that connects
the matching device or a path between the matching device and the upper electrode or the lower electrode and
the variable passive component or a path between the variable passive component and the edge ring.

(Additional Statement B8)

The plasma processing apparatus of additional statement B5, wherein said at least one bias power supply is configured to apply, as the bias power, at least one negative pulse voltage having different frequencies, and
said at least one bias power supply is connected to the lower electrode through at least one first RF filter.

(Additional Statement B9)

The plasma processing apparatus of additional statement B8, wherein said at least one bias power supply is connected to the edge ring through a second RF filter.

(Additional Statement B10)

The plasma processing apparatus of additional statement B9, wherein the bypass circuit is disposed on a second path that connects
the matching device or a path between the matching device and the upper electrode or the lower electrode and
the second RF filter or a path between the second RF filter and the edge ring.

(Additional Statement B11)

The plasma processing apparatus of additional statement B10, wherein the second RF filter includes said at least one variable passive component.

(Additional Statement B12)

The plasma processing apparatus of any one of additional statements B1 to B4, wherein the power supply further includes a DC power supply configured to apply a negative DC voltage to the edge ring, the DC power supply being connected to the edge ring through at least one third RF filter.

(Additional Statement B13)

The plasma processing apparatus of additional statement B12, wherein the bypass circuit is disposed on a third path that connects
the matching device or a path between the matching device and the upper electrode or the lower electrode and
the DC power supply or a path between the DC power supply and the edge ring.

(Additional Statement B14)

The plasma processing apparatus of additional statement B13, wherein said third RF filter includes said at least one variable passive component.

(Additional Statement B15)

The plasma processing apparatus of any one of additional statements B12 to B14, further comprising:
a lifting device configured to lift and lower the edge ring.

(Additional Statement B16)

The plasma processing apparatus of any one of additional statements B1 to B4, wherein the source power supply is configured to apply a negative first pulse voltage as the source power,
said at least one bias power supply is configured to apply at least one negative second pulse voltage as the bias power, and
a frequency of the first pulse voltage and a frequency of the second pulse voltage are different.

(Additional Statement B17)

The plasma processing apparatus of additional statement B16, wherein said at least one bias power supply is connected to the lower electrode through a fourth RF filter and connected to the edge ring through a fifth RF filter, and
the bypass circuit is disposed on a fourth path that connects
the fourth RF filter or a path between the fourth RF filter and the lower electrode and
the fifth RF filter or a path between the fifth RF filter and the edge ring.

(Additional Statement B18)

A plasma processing apparatus comprising:
a chamber;
a substrate support disposed in the chamber and including a lower electrode, a substrate supporting surface for supporting a substrate, and an edge ring disposed to surround the substrate placed on the substrate supporting surface;
an upper electrode disposed above the lower electrode;
a power supply configured to supply two or more powers having different frequencies, the power supply including a source power supply configured to supply a source power for generating plasma from a gas in the chamber to the upper electrode or the lower electrode, and at least one bias power supply configured to supply one bias power or two or more bias powers having different frequencies to the lower electrode;
a lifting device configured to lift and lower the edge ring; and
at least one bypass circuit that electrically connects the power supply and the edge ring and is configured to supply a part of at least one power selected from the group consisting of the source power and at least one bias power to the edge ring.

(Additional Statement B19)

The plasma processing apparatus of additional statement B18, wherein the bypass circuit is disposed on a fifth path that connects the matching circuit or a path between the matching circuit and the upper electrode or the lower electrode and the edge ring.

(Additional Statement B20)

An etching method using a plasma processing apparatus, wherein the plasma processing apparatus includes:
  a chamber;
  a substrate support disposed in the chamber and including a lower electrode, a substrate supporting surface for supporting a substrate, and an edge ring disposed to surround the substrate placed on the substrate supporting surface;
  an upper electrode disposed above the lower electrode;
  a power supply configured to supply two or more powers having different frequencies, the power supply including a source power supply configured to supply a source power for generating plasma from a gas in the chamber to the upper electrode or the lower electrode, and at least one bias power supply configured to supply one bias power or two or more bias powers having different frequencies to the lower electrode;
  at least one variable passive component electrically connected to the edge ring; and
  at least one bypass circuit that electrically connects the power supply and the edge ring and is configured to supply a part of at least one power selected from the group consisting of the source power and at least one bias power to the edge ring,
the etching method comprising:
  (a) placing a substrate on the substrate supporting surface;
  (b) generating plasma from a gas in the chamber;
  (c) etching the substrate using the generated plasma; and
  (d) controlling the amount of power supplied to the edge ring using the bypass circuit to adjust an incidence angle of ions in the plasma with respect to an edge region of the substrate.

The invention claimed is:

1. A plasma processing apparatus comprising:
  a chamber;
  a substrate support disposed in the chamber and including a lower electrode, a substrate supporting surface for supporting a substrate, and an edge ring disposed to surround the substrate placed on the substrate supporting surface;
  an upper electrode disposed above the lower electrode;
  a power supply configured to supply two or more powers having different frequencies, the power supply including a source power supply configured to supply a source power for generating plasma from a gas in the chamber to the upper electrode or the lower electrode, and at least one bias power supply configured to supply one bias power or two or more bias powers having different frequencies to the lower electrode;
  at least one variable passive component electrically connected to the edge ring; and
  at least one bypass circuit that electrically connects the power supply and the edge ring and is configured to supply a part of at least one power selected from the group consisting of the source power and at least one bias power to the edge ring.

2. The plasma processing apparatus of claim 1, wherein said at least one bypass circuit is configured to supply a part of said at least one power selected depending on a frequency to the edge ring.

3. The plasma processing apparatus of claim 2, wherein said at least one bypass circuit is configured to include a combination of a bypass circuit independently provided for each frequency and a bypass circuit commonly provided for a plurality of frequencies.

4. The plasma processing apparatus of claim 1, wherein said at least one bypass circuit is configured to control a magnitude of said at least one power supplied to the edge ring.

5. The plasma processing apparatus of claim 1, wherein the source power supply is configured to supply a source RF power as the source power, and
  said at least one bias power supply is configured to apply, as the bias power, at least one bias RF power having different frequencies or at least one negative pulse voltage having different frequencies.

6. The plasma processing apparatus of claim 5, further comprising:
  a matching device including a first matching circuit and at least one second matching circuit,
  wherein said at least one bias power supply is configured to supply, as the bias power, at least one bias RF power having different frequencies,
  the source power supply is connected to the upper electrode or the lower electrode through the first matching circuit, and
  said at least one bias power supply is connected to the lower electrode through said at least one second matching circuit.

7. The plasma processing apparatus of claim 6, wherein the bypass circuit is disposed on a first path that connects
  the matching device or a path between the matching device and the upper electrode or the lower electrode and
  the variable passive component or a path between the variable passive component and the edge ring.

8. The plasma processing apparatus of claim 5, wherein said at least one bias power supply is configured to apply, as the bias power, at least one negative pulse voltage having different frequencies, and
  said at least one bias power supply is connected to the lower electrode through at least one first RF filter.

9. The plasma processing apparatus of claim 8, wherein said at least one bias power supply is connected to the edge ring through a second RF filter.

10. The plasma processing apparatus of claim 9, wherein the bypass circuit is disposed on a second path that connects
  the matching device or a path between the matching device and the upper electrode or the lower electrode and
  the second RF filter or a path between the second RF filter and the edge ring.

11. The plasma processing apparatus of claim 10, wherein the second RF filter includes said at least one variable passive component.

12. The plasma processing apparatus of claim 1, wherein the power supply further includes a DC power supply configured to apply a negative DC voltage to the edge ring, the DC power supply being connected to the edge ring through at least one third RF filter.

13. The plasma processing apparatus of claim 12, wherein the bypass circuit is disposed on a third path that connects
  the matching device or a path between the matching device and the upper electrode or the lower electrode and
  the DC power supply or a path between the DC power supply and the edge ring.

14. The plasma processing apparatus of claim 13, wherein said third RF filter includes said at least one variable passive component.

15. The plasma processing apparatus of claim 12, further comprising:
   a lifting device configured to lift and lower the edge ring.

16. The plasma processing apparatus of claim 1, wherein the source power supply is configured to apply a negative first pulse voltage as the source power,
   said at least one bias power supply is configured to apply at least one negative second pulse voltage as the bias power, and
   a frequency of the first pulse voltage and a frequency of the second pulse voltage are different.

17. The plasma processing apparatus of claim 16, wherein said at least one bias power supply is connected to the lower electrode through a fourth RF filter and connected to the edge ring through a fifth RF filter, and
   the bypass circuit is disposed on a fourth path that connects
   the fourth RF filter or a path between the fourth RF filter and the lower electrode and
   the fifth RF filter or a path between the fifth RF filter and the edge ring.

* * * * *